United States Patent
Inagaki

(10) Patent No.: US 10,286,648 B2
(45) Date of Patent: May 14, 2019

(54) PERIPHERAL PORTION PROCESSING DEVICE AND PERIPHERAL PORTION PROCESSING METHOD

(71) Applicant: SCREEN HOLDINGS CO., LTD., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/665,956

(22) Filed: Aug. 1, 2017

(65) Prior Publication Data
US 2018/0056646 A1    Mar. 1, 2018

(30) Foreign Application Priority Data

Aug. 25, 2016    (JP) .................................. 2016-164696

(51) Int. Cl.
| | | |
|---|---|---|
| *H01L 21/67* | (2006.01) | |
| *B41J 2/045* | (2006.01) | |
| *B05D 1/02* | (2006.01) | |
| *B24B 9/00* | (2006.01) | |

(52) U.S. Cl.
CPC ............ *B41J 2/04505* (2013.01); *B05D 1/02* (2013.01); *B24B 9/00* (2013.01); *B41J 2/04586* (2013.01); *H01L 21/6708* (2013.01); *H01L 21/6715* (2013.01); *H01L 21/67028* (2013.01); *H01L 21/67178* (2013.01); *H01L 21/67253* (2013.01)

(58) Field of Classification Search
CPC ............... B41J 2/04505; B41J 2/04586; H01L 21/67253; H01L 21/67178; H01L 21/6715; H01L 21/67028; H01L 21/6708; B05D 1/02; B24B 9/00
See application file for complete search history.

(56) References Cited

U.S. PATENT DOCUMENTS

| | | | |
|---|---|---|---|
| 2005/0057587 A1* | 3/2005 | Cheng ................... | B41J 2/04516 347/10 |
| 2013/0089668 A1* | 4/2013 | Inagaki ............... | H01L 21/6715 427/261 |
| 2014/0124479 A1 | 5/2014 | Tomita et al. ................... | 216/85 |

FOREIGN PATENT DOCUMENTS

| | | | | |
|---|---|---|---|---|
| JP | 2001-110712 | * | 4/2001 | ........... H01L 21/027 |
| JP | 2001-110712 A | * | 4/2001 | ........... H01L 21/027 |
| JP | 2005-088567 A | | 4/2005 | |
| JP | 2014-091105 A | | 5/2014 | |
| KR | 10-2013-0037 A | | 4/2013 | |

OTHER PUBLICATIONS

Decision to Grant a Patent dated Mar. 20, 2019 in counterpart Korean Patent Application No. 10-2017-0106153.

* cited by examiner

*Primary Examiner* — Yaovi M Ameh
(74) *Attorney, Agent, or Firm* — Ostrolenk Faber LLP

(57) ABSTRACT

A substrate is held and rotated by a spin chuck. A processing liquid is discharged from a discharger to the substrate rotated by the spin chuck. The discharger has a plurality of discharge ports arranged in one direction and can selectively discharge the processing liquid from the plurality of respective discharge ports. With a row of the plurality of discharge ports of the discharger crossing and facing a peripheral portion of the substrate rotated by the spin chuck, the processing liquid is supplied to a position further outward than an inner edge of the peripheral portion. The processing liquid is not supplied to a position further inward than the inner edge of the peripheral portion of the substrate.

13 Claims, 14 Drawing Sheets

PERIPHERAL PORTION PROCESSING DEVICE AND PERIPHERAL PORTION PROCESSING METHOD

BACKGROUND OF THE INVENTION

Field of the Invention

The present invention relates to a peripheral portion processing device and a peripheral portion processing method for processing a peripheral portion of a substrate using a processing liquid.

Description of Related Art

In a substrate processing apparatus, a substrate horizontally supported by a spin chuck is rotated. In this state, a processing liquid is discharged from a nozzle to a substantially center portion of an upper surface of the substrate, whereby the processing liquid is supplied to the entire surface of the substrate. Thereafter, predetermined thermal processing is performed, so that a thin film made of the processing liquid is formed on the surface of the substrate. In the case where the thin film is formed at a peripheral portion of the substrate, when a transport device that transports the substrate holds the peripheral portion of the substrate, the film is stripped off and becomes particles. The processing liquid is supplied to the entire surface of the substrate, and then processing for removing the processing liquid at the peripheral portion of the substrate is performed (see JP 2001-110712 A, for example).

In a coating film removal device described in JP 2001-110712 A, a position of the peripheral portion of the substrate held by the spin chuck is detected by a detection mechanism. In this state, the spin chuck is rotated by 360°, whereby a rotation phase of the spin chuck and a corresponding position of the peripheral portion of the substrate are acquired. A rinse liquid is discharged from a rinse liquid discharge nozzle to the peripheral portion of the rotating substrate, whereby a resist liquid at the peripheral portion of the substrate is removed. During the discharge of the rinse liquid, positions of the spin chuck or the rinse liquid discharge nozzle are adjusted by an alignment mechanism such that a positional deviation of the peripheral portion of the substrate due to the rotation of the spin chuck is compensated.

BRIEF SUMMARY OF THE INVENTION

In JP 2001-110712 A, it is described that the unnecessary coating film formed at the peripheral portion of the substrate can be removed with high accuracy. However, in a method described in JP 2001-110712 A, a protrusion is generated at the outer periphery of the coating film after the removal. Therefore, a shape of the coating film at the peripheral portion of the substrate cannot be controlled accurately, and it is difficult to perform processing on the peripheral portion of the substrate with high accuracy.

An object of the present invention is to provide a peripheral portion processing device capable of performing processing for a peripheral portion of a substrate with high accuracy, and a peripheral portion processing method by which the processing for the peripheral portion of the substrate can be performed with high accuracy.

(1) A peripheral portion processing device according to one aspect of the present invention that performs processing on an annular peripheral portion extending along an outer periphery of one surface of a substrate at least partially having the circular outer periphery includes a rotation holder that holds and rotates the substrate, a discharger that has a plurality of discharge ports arranged in one direction and is configured to be capable of selectively discharging a processing liquid from the plurality of respective discharge ports, and a discharge controller that controls discharge of the processing liquid from the plurality of discharge ports of the discharger such that, with a row of the plurality of discharge ports of the discharger crossing and facing the peripheral portion of the substrate rotated by the rotation holder, the processing liquid is not supplied to a position further inward than an inner edge of the peripheral portion and is supplied to a position further outward than the inner edge of the peripheral portion.

In this peripheral portion processing device, the substrate is held and rotated by the rotation holder. The processing liquid is discharged from the discharger to the substrate rotated by the rotation holder. The discharger has the plurality of discharge ports arranged in the one direction and is capable of selectively discharging the processing liquid from the plurality of respective discharge ports. With the row of the plurality of discharge ports of the discharger crossing and facing the peripheral portion of the substrate rotated by the rotation holder, the processing liquid is supplied to a position further outward than the inner edge of the peripheral portion.

In this configuration, the processing liquid is not supplied from the discharger to a position further inward than the inner edge of the peripheral portion of the substrate. Further, it is not necessary to discharge the processing liquid at a high pressure when the processing liquid is supplied to a position further outward than the inner edge of the peripheral portion of the substrate. Therefore, rebounding of the processing liquid from one surface of the substrate is reduced, and the processing liquid is prevented from rebounding to a position further inward than the inner edge of the peripheral portion of the substrate. Thus, the processing for the peripheral portion of the substrate can be performed with high accuracy.

(2) The peripheral portion processing device may further includes a position change detector that detects a change in position of the outer periphery of the substrate rotated by the rotation holder, and a discharge port determiner that, based on the change in position of the outer periphery of the substrate detected by the position change detector, determines a relationship between a rotation angle of the substrate held by the rotation holder and one or more discharge ports, from which the processing liquid is to be discharged, of the plurality of discharge ports, wherein the discharge controller may allow the processing liquid to be discharged from the one or more discharge ports of the plurality of discharge ports of the discharger based on the rotation angle of the substrate rotated by the rotation holder and the relationship determined by the discharge port determiner. In this configuration, even in the case where the center of the substrate deviates from the rotational center of the rotation holder, the processing for the peripheral portion of the substrate can be performed with high accuracy.

(3) The position change detector may include a positional relationship detector that detects a relationship between the position of the outer periphery of the substrate rotated by the rotation holder and positions of the plurality of discharge ports of the discharger for each rotation angle of the substrate, and the discharge port determiner may determine a relationship between the rotation angle of the substrate held by the rotation holder and the one or more discharge ports, from which the processing liquid is to be discharged, of the plurality of discharge ports based on the relationship detected by the positional relationship detector. In this case, the relationship between the position of the outer periphery of the substrate and the positions of the plurality of discharge ports of the discharger is specified. Thus, even in the case where the discharger is not fixed, the processing for the peripheral portion of the substrate can be performed with high accuracy.

(4) The positional relationship detector may produce image data indicating images of the outer periphery of the substrate and the discharger, and may detect a relationship between the position of the outer periphery of the substrate and the positions of the plurality of discharge ports of the discharger based on the produced image data. In this case, the relationship between the position of the outer periphery and the positions of the plurality of discharge ports of the discharger can be specified with a simple configuration based on the image data.

(5) The discharge port determiner may determine a discharge port that is opposite to the inner edge of the peripheral portion of the substrate and a discharge port that is opposite to a region located at a position further outward than the inner edge of the peripheral portion of the substrate as the one or more first discharge ports, from which the processing liquid is to be discharged, of the plurality of discharge ports, and the discharge controller may allow the processing liquid to be discharged from the one or more first discharge ports determined by the discharge port determiner. In this case, the processing liquid can be accurately and reliably supplied to the peripheral portion of the substrate.

(6) The discharge port determiner may determine a periodic curve indicating the change in position of the outer periphery of the substrate rotated by the rotation holder, and may determine the one or more first discharge ports based on the periodic curve. In this case, the one or more discharge ports from which the processing liquid is to be discharged can be easily determined based on the periodic curve.

(7) The discharge port determiner may determine a discharge port located at a position further outward than the outer periphery of the substrate as one or more second discharge ports, from which the processing liquid is not to be discharged, of the plurality of discharge ports based on a relationship detected by the position change detector, and the discharge controller does not have to allow the processing liquid to be discharged from the one or more second discharge ports determined by the discharge port determiner. In this case, it is possible to reduce the consumption of the processing liquid with no influence on the processing for the peripheral portion of the substrate.

(8) The peripheral portion processing device may further include a mover that moves the discharger to a position opposite to the peripheral portion of the substrate held by the rotation holder, and a mover controller that controls an operation of the mover, wherein the mover controller may control the mover based on the change in position of the outer periphery of the substrate detected by the position change detector such that the row of the plurality of discharge ports crosses the peripheral portion of the substrate rotated by the rotation holder and is moved to the position opposite to the peripheral portion.

In this case, the discharger can be appropriately arranged at the position opposite to the peripheral portion of the substrate during the peripheral portion processing. Further, it is not necessary to arrange the discharger at the position opposite to the peripheral portion of the substrate during processing except for the peripheral portion processing. Thus, another processing can be smoothly performed.

(9) The plurality of discharge ports may discharge a removal liquid for removing liquid applied to the peripheral portion of the substrate as the processing liquid. In this case, the peripheral portion processing device can perform removal processing for removing the liquid applied to the peripheral portion of the substrate.

(10) The plurality of discharge ports may discharge a coating liquid for forming a coating film at the peripheral portion of the substrate as the processing liquid. In this case, the peripheral portion processing device can perform coating processing for forming the coating film at the peripheral portion of the substrate.

(11) The discharger may include an inkjet type head. In this case, the processing liquid can be easily and selectively discharged from the plurality of respective discharge ports of the discharger.

(12) A peripheral portion processing method according to another aspect of the present invention for performing processing on an annular peripheral portion extending along an outer periphery of one surface of a substrate at least partially having the circular outer periphery, including the steps of holding and rotating the substrate by a rotation holder, and discharging a processing liquid from a discharger, wherein the discharger has a plurality of discharge ports arranged in one direction and can selectively discharge the processing liquid from the plurality of respective discharge ports, and the step of discharging the processing liquid includes not supplying the processing liquid to a position further inward than an inner edge of the peripheral portion and supplying the processing liquid to a position further outward than the inner edge of the peripheral portion with a row of the plurality of discharge ports of the discharger crossing and facing the peripheral portion of the substrate rotated by the rotation holder.

In this peripheral portion processing method, the substrate is held and rotated by the rotation holder. The processing liquid is discharged from the discharger to the substrate rotated by the rotation holder. The discharger has the plurality of discharge ports arranged in the one direction and is capable of selectively discharging the processing liquid from the plurality of respective discharge ports. With the row of the plurality of discharge ports of the discharger crossing and facing the peripheral portion of the substrate rotated by the rotation holder, the processing liquid is supplied to a position further outward than the inner edge of the peripheral portion.

In this method, the processing liquid is not supplied from the discharger to a position further inward than the inner edge of the peripheral portion of the substrate. Further, it is not necessary to discharge the processing liquid at a high pressure when the processing liquid is supplied to a position further outward than the inner edge of the peripheral portion of the substrate. Therefore, rebounding of the processing liquid from the one surface of the substrate is reduced, and the processing liquid is prevented from rebounding to a position further inward than the inner edge of the peripheral portion of the substrate. Thus, the processing for the peripheral portion of the substrate can be performed with high accuracy.

Other features, elements, characteristics, and advantages of the present invention will become more apparent from the following description of preferred embodiments of the present invention with reference to the attached drawings.

DESCRIPTION OF THE PREFERRED EMBODIMENTS

A peripheral portion processing device and a peripheral portion processing method according to one embodiment of the present invention will be described below with reference to drawings. In the present embodiment, a coating processing unit that performs coating processing on a substrate is described as an example of the peripheral portion processing device. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, the substrate used in the present embodiment at least partially has a circular outer periphery. For example, the outer periphery except for a notch for positioning is circular.

(1) Configuration of Coating Processing Unit

Figure 1:
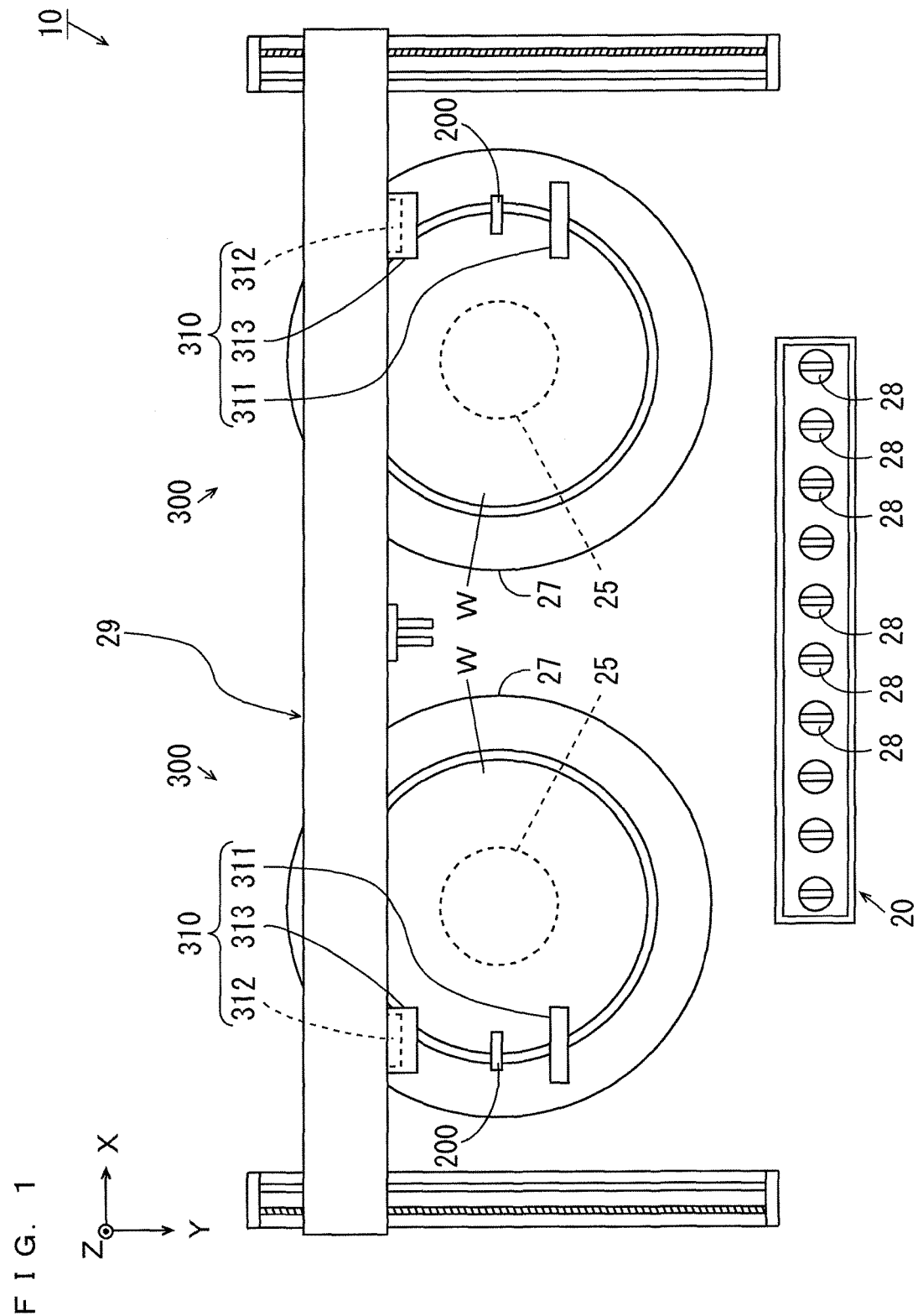
FIG. 1 is a schematic plan view showing a configuration of a coating processing unit according to one embodiment of the present invention.

FIG. 1 is a schematic plan view showing the configuration of the coating processing unit according to the one embodiment of the present invention. As shown in FIG. 1, the coating processing unit (a spin coater) 10 includes a waiting section 20, a plurality of spin chucks 25, a plurality of cups 27, a plurality of coating liquid nozzles 28, a nozzle transport device 29, a plurality of nozzle units 200 and a plurality of position detection units 300.

In the present embodiment, the two spin chucks 25, the two cups 27, the two nozzle units 200 and the two position detection units 300 are provided in each coating processing unit 10. Details of the position detection units 300 will be described below.

Each spin chuck 25 is driven to be rotated by a driving device (not shown) such as an electric motor while holding the substrate W. Each cup 27 is provided to surround the spin chuck 25. During the wait, each coating liquid nozzle 28 is inserted into the waiting section 20. Various types of coating liquids are supplied from a coating liquid storage (not shown) to each coating liquid nozzle 28 through a coating liquid pipe.

Any coating liquid nozzle 28 of the plurality of coating liquid nozzles 28 is moved to a position above the substrate W by the nozzle transport device 29. A coating liquid (a photosensitive liquid such as a resist liquid in the present example) is discharged from the coating liquid nozzle 28 while the spin chuck 25 is rotated, whereby the coating liquid is applied onto the rotating substrate W. Thus, a film of the coating liquid (hereinafter referred to as a coating film) is formed on the substrate W.

Each nozzle unit 200 discharges a removal liquid (a rinse liquid in the present example) towards a peripheral portion of the rotating substrate W. The peripheral portion of the substrate W here refers to an annular region between the circular outer periphery of the substrate W and a circle located at a position further inward than the outer periphery and spaced apart from the outer periphery by a constant distance. Thus, the coating film formed at the peripheral portion of the substrate W is dissolved. As a result, the coating film at the peripheral portion of the substrate W is removed.

(2) Configuration of Nozzle Units

Figure 2:
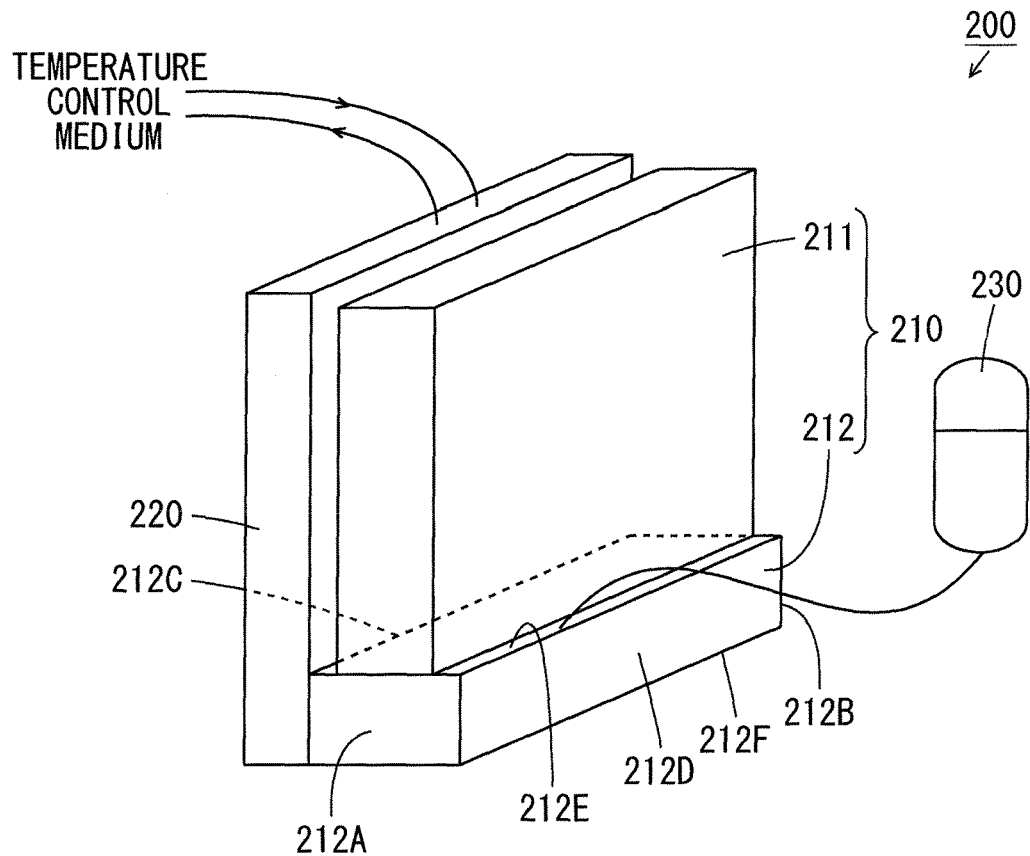
FIG. 2 is a schematic perspective view showing a configuration of a nozzle unit of FIG. 1.
Figure 8:
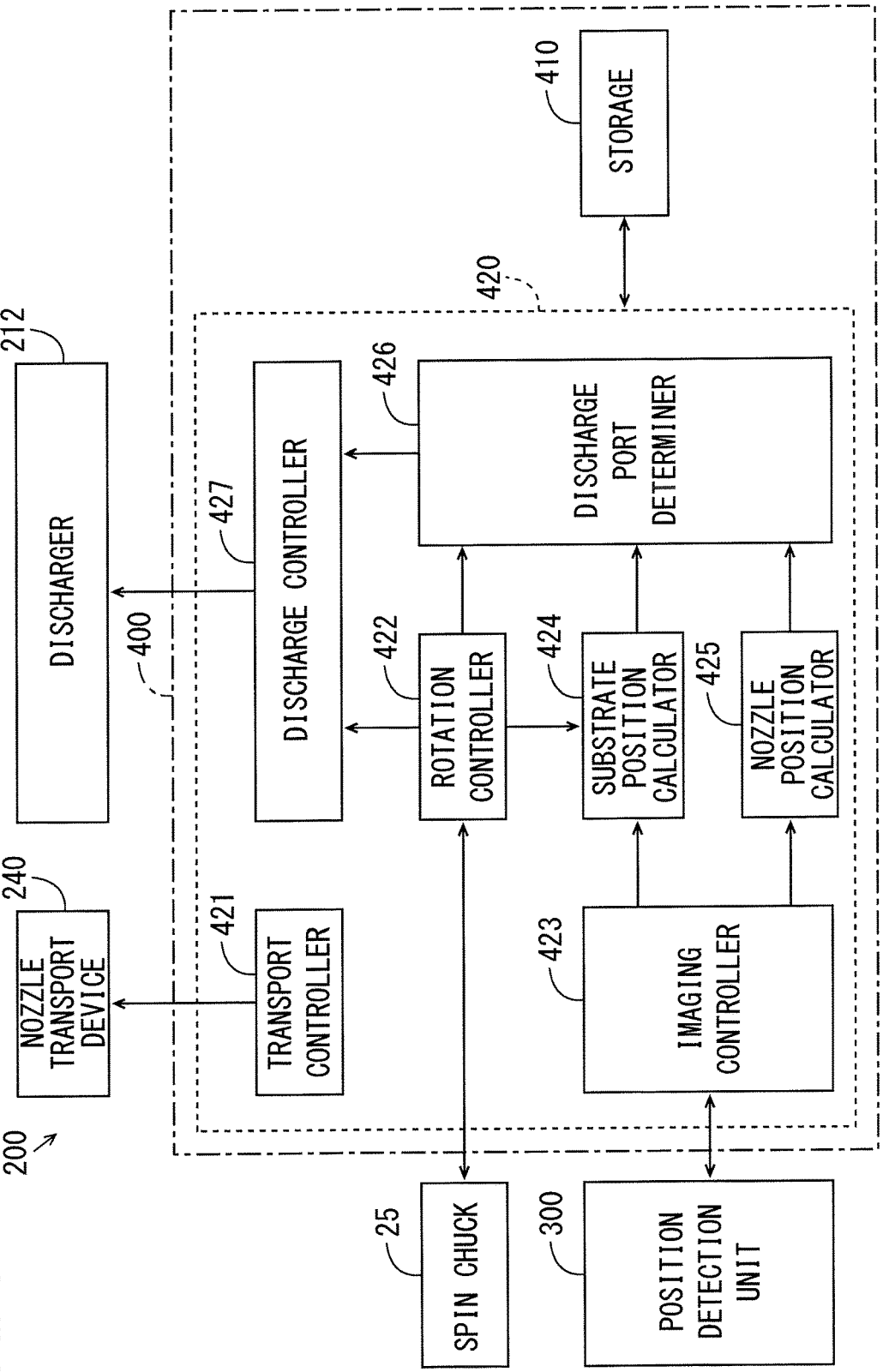
FIG. 8 is a block diagram showing a configuration of a local controller for controlling the coating processing unit of FIG. 1.

FIG. 2 is a schematic perspective view showing a configuration of one nozzle unit 200 provided in the coating processing unit 10 of FIG. 1. The configuration of the other nozzle unit 200 provided in the coating processing unit 10 is similar to the configuration of the nozzle unit 200 of FIG. 2. As shown in FIG. 2, the nozzle unit 200 includes a head portion 210, a temperature controller 220, a storage 230 and a nozzle transport device 240 (FIG. 8, described below).

The head portion 210 is constituted by an inkjet type head and includes a supporter 211 and a discharger 212. The discharger 212 has a rectangular parallelepiped shape extending in one direction and includes a pair of rectangular end surfaces 212A, 212B, a pair of rectangular side surfaces 212C, 212D, a rectangular upper surface 212E and a rectangular bottom surface 212F.

The pair of end surfaces 212A, 212B are respectively positioned at both ends in a longitudinal direction of the discharger 212. The pair of side surfaces 212C, 212D are respectively positioned at both ends in a width direction of the discharger 212. The supporter 211 is formed on the upper surface 212E of the discharger 212 and attached to the nozzle transport device 240 (FIG. 8, described below). The discharger 212 discharges a rinse liquid from the bottom surface 212F.

The temperature controller 220 is attached to come into contact with the side surface 212C of the discharger 212. A temperature control medium such as pure water having an adjusted temperature circulates in the temperature controller 220. Thus, the temperature of the rinse liquid discharged from the discharger 212 is adjusted. The rinse liquid is stored in the storage 230. The rinse liquid stored in the storage 230 is supplied to the discharger 212 of the head portion 210.

Figure 3:
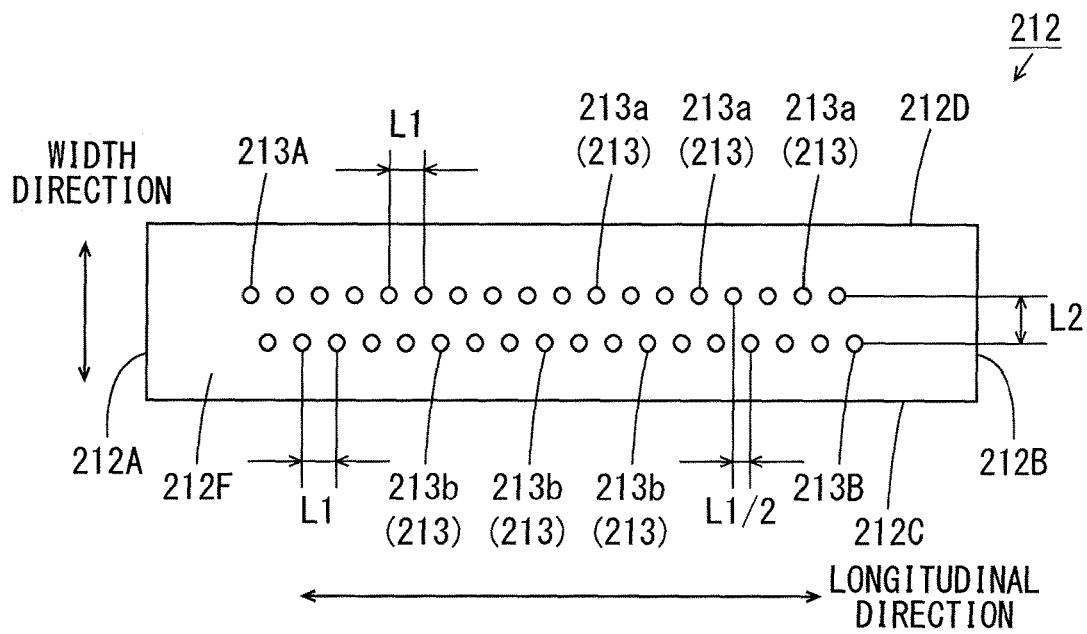
FIG. 3 is a schematic bottom view showing a discharger of FIG. 2.

FIG. 3 is a schematic bottom view showing the discharger 212 of FIG. 2. As shown in FIG. 3, a plurality of discharge ports 213 through which the rinse liquid is discharged are formed in the substantially rectangular bottom surface 212F of the discharger 212. In the example of FIG. 3, discharge ports 213a that are substantially half of the plurality of discharge ports 213, and discharge ports 213b that are substantially remaining half of the plurality of discharge ports 213 are arranged in two rows in the longitudinal direction of the discharger 212.

A distance (a pitch) between centers of two adjacent discharge ports 213a and a distance (a pitch) between centers of two adjacent discharge ports 213b are respectively L1. In the longitudinal direction, a distance between centers of a discharge port 213a and a discharge port 213b that are adjacent to each other is L1/2. That is, in the longitudinal direction, each discharge port 213b is located at a center position between adjacent discharge ports 213a, and each discharge port 213a is located at a center position between adjacent discharge ports 213b. In the width direction, a distance (a pitch) between centers of a discharge port 213a and a discharge port 213b is L2.

In the present example, the distance L1 is 0.1693 mm, for example. The distance L2 is 0.508 mm, for example. The distances L1, L2 are not limited to these values and may be other values. Further, a size (dimension) of each discharge port 213a and a size (dimension) of each discharge port 213b may be equal to each other or different from each other.

In the following description, a discharge port 213 (a discharge port 213a in the present example), closest to the end surface 212A, of the plurality of discharge ports 213 is referred to as an end discharge port 213A in particular. A discharge port 213 (a discharge port 213b in the present example), closest to the end surface 212B, of the plurality of discharge ports 213 is referred to as an end discharge port 213B in particular.

The discharger 212 has a plurality of flow paths for respectively leading a removal liquid to the plurality of discharge ports 213. Pressurizing elements such as piezoelectric elements are respectively provided in the plurality of flow paths. The pressurizing elements provided in the plurality of flow paths are respectively and independently controlled, whereby the discharge of the removal liquid from the plurality of respective discharge ports 213 is independently controlled.

(3) Operation of Nozzle Units

Figure 4A:
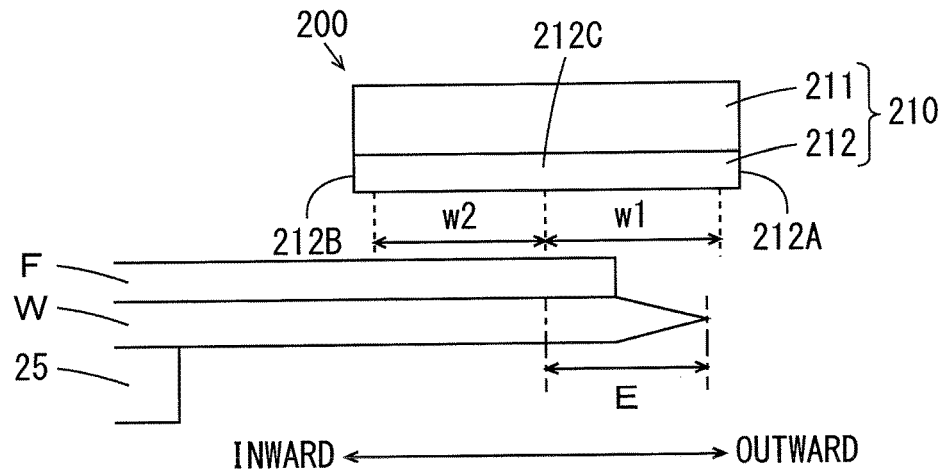
FIGS. 4A to 4C are diagrams for explaining one example of an operation of the nozzle unit.
Figure 4B:
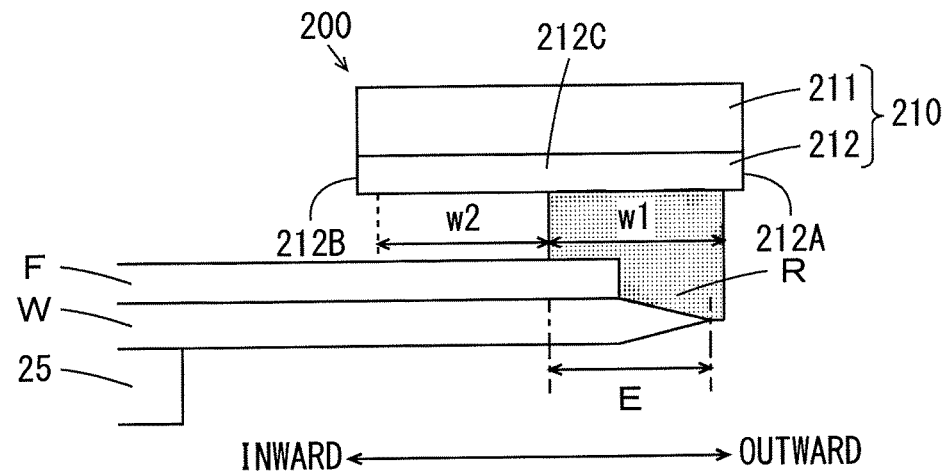
Figure 4C:
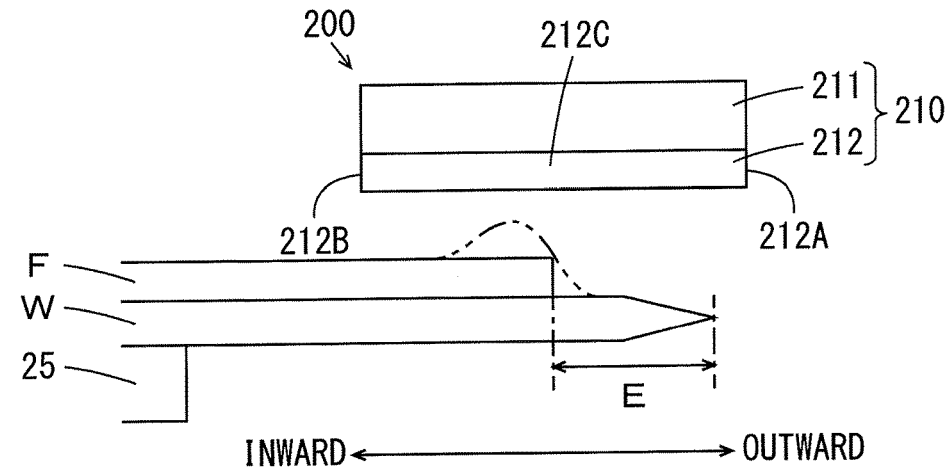

FIGS. 4A to 4C are diagrams for explaining one example of the operation of the nozzle unit 200. In FIGS. 4A to 4C, the temperature controller 220 of FIG. 2 is not shown. The same is true for FIGS. 5A to 5C, described below. As shown in FIG. 4A, the coating film F is formed on a surface of the substrate W by the coating liquid nozzle 28 of FIG. 1. A width E (hereinafter referred to as an edge cut width E) of the peripheral portion of the substrate W from which the coating liquid F is to be removed is set in advance.

During the removal of the coating film F at the peripheral portion, the head portion 210 is moved by the nozzle transport device 240 (FIG. 8, described below) from a predetermined waiting position to a discharge position above the peripheral portion of the substrate W. At the discharge position, the head portion 210 is positioned such that the discharger 212 extends in a radial direction of the substrate W, and is positioned such that the peripheral portion of the substrate W is opposite to the bottom surface 212F of the discharger 212. Thus, the end surface 212A of the discharger 212 is located at a position further outward than the peripheral portion of the substrate W, and the end surface 212B of the discharger 212 is located at a position further inward than the peripheral portion of the substrate W.

As described above, the discharger 212 is configured to be capable of discharging the rinse liquid independently from the plurality of respective discharge ports 213 of FIG. 3. Further, as described below, a positional relationship between the discharger 212 at the discharge position and the substrate W is specified. Then, discharge ports 213, which discharge the rinse liquid, and discharge ports 213, which do not discharge the rinse liquid, of the plurality of discharge ports 213 are determined such that the coating film F having the edge cut width E at the peripheral portion of the substrate W is removed.

In the example of FIG. 4B, the rinse liquid R is discharged from a plurality of discharge ports 213 (FIG. 3) included in a region having a width w1 from the end discharge port 213A (FIG. 3) towards the end surface 212B of the discharger 212 in the longitudinal direction of the discharger 212. On the other hand, the rinse liquid R is not discharged from a plurality of discharge ports 213 included in a region having a width w2 from the end discharge port 213B (FIG. 3) towards the end surface 212A of the discharger 212 in the longitudinal direction of the discharger 212.

Thus, as shown in FIG. 4C, a portion of the coating film F in a region having the edge cut width E at the peripheral portion of the substrate W is removed. In this configuration, a protrusion (see a two-dots and dash line of FIG. 4C) is prevented from being generated at the outer periphery of the coating film F after the removal. Thus, the removal of the coating film F at the peripheral portion of the substrate W can be performed with high accuracy.

Figure 5A:
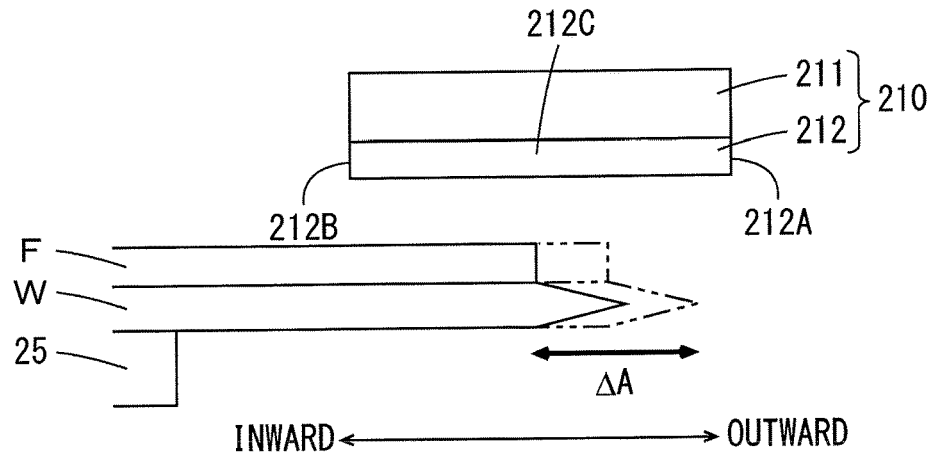
FIGS. 5A to 5C are diagrams for explaining another example of the operation of the nozzle unit.
Figure 5B:
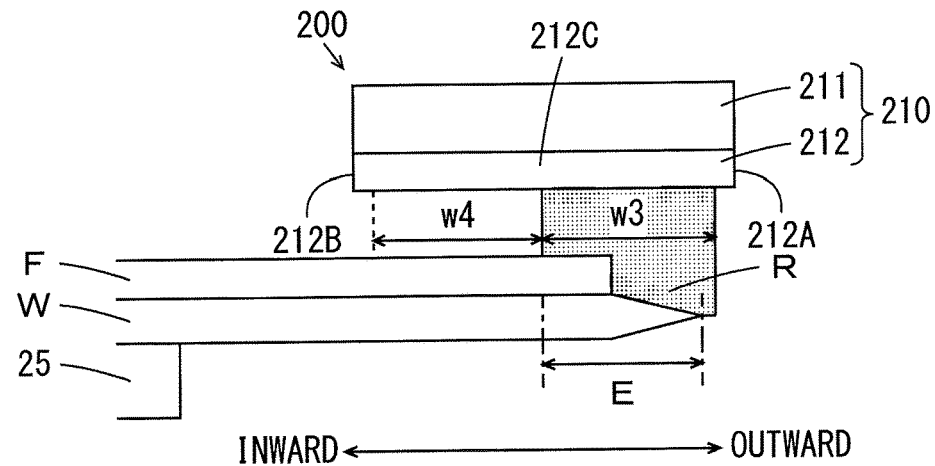
Figure 5C:
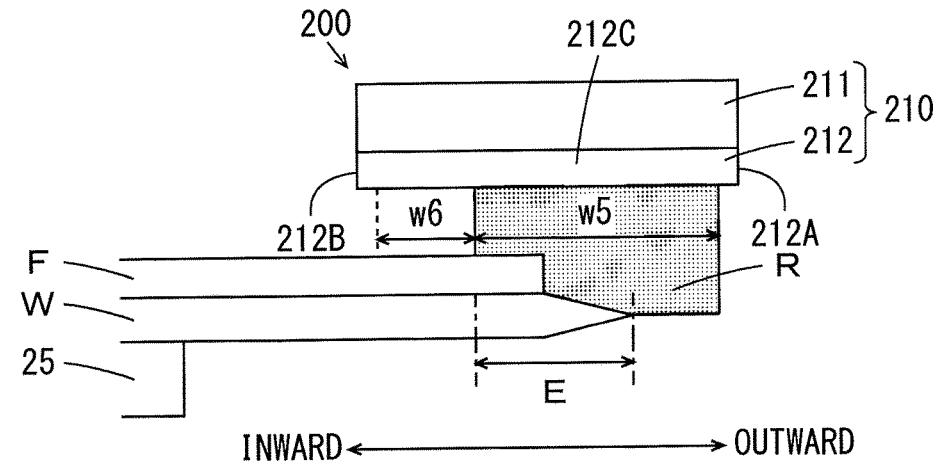

FIGS. 5A to 5C are diagrams for explaining another example of the operation of the nozzle unit 200. The substrate W is placed such that its center substantially coincides with a rotational center of the spin chuck 25. However, a deviation of about 100 μm is generated between the center of the substrate W and the rotational center of the spin chuck 25 due to the restriction on the mechanical accuracy of various members in the transport device that transports the substrate W to the spin chuck 25.

In the case where the spin chuck 25 is rotated in this state, a position of the outer periphery of the substrate W is changed as indicated by a thick arrow in FIG. 5A. In FIG. 5A, the substrate W that is displaced at an innermost position is indicated by a solid line, and the substrate W that is displaced at an outermost position is indicated by a two-dots and dash line. An amplitude of the displacement is ΔA. The amplitude used here means a total amplitude (both amplitudes), that is, a peak to peak value. Even in such a case, discharge ports 213, which discharge the rinse liquid, and discharge ports 213, which do not discharge the rinse liquid, of the plurality of discharge ports 213 are sequentially determined according to a rotation angle of the substrate W such that the coating film F having the edge cut width E at the peripheral portion is removed in response to the displacement of the substrate W.

In the example of FIG. 5B, the substrate W is displaced at the outermost position. At this time, the rinse liquid R is discharged from a plurality of discharge ports 213 (FIG. 3) included in a region having a width w3 from the end discharge port 213A (FIG. 3) towards the end surface 212B of the discharger 212 in the longitudinal direction of the discharger 212. On the other hand, the rinse liquid R is not discharged from a plurality of discharge ports 213 included in a region having a width w4 from the end discharge port 213B (FIG. 3) towards the end surface 212A of the discharger 212 in the longitudinal direction of the discharger 212.

In the example of FIG. 5C, the substrate W is displaced at the innermost position. At this time, the rinse liquid R is discharged from a plurality of discharge ports 213 included in a region having a width w5 from the end discharge port 213A towards the end surface 212B of the discharger 212 in the longitudinal direction of the discharger 212. On the other hand, the rinse liquid R is not discharged from a plurality of discharge ports 213 included in a region having a width w6 from the end discharge port 213B towards the end surface 212A of the discharger 212 in the longitudinal direction of the discharger 212. The width w5 is larger than the width w3, and the width w6 is smaller than the width w4.

Thus, similarly to the example of FIG. 4C, a portion of the coating film F in the region having the edge cut width E at the peripheral portion of the substrate W is removed. In this configuration, even in the case where the substrate W is rotated while being eccentric from the spin chuck 25 due to a deviation between the center of the substrate W and the rotational center of the spin chuck 25, the coating film F at the peripheral portion of the substrate W can be removed with high accuracy, and the edge cut width E can be a desired constant value. In the following description, regions such as the regions having the widths w1, w3, w5, in the bottom surface 212F of the discharger 212, from which the rinse liquid R is discharged are referred to as discharge regions.

(4) Configuration of Position Detection Units

Figure 6:
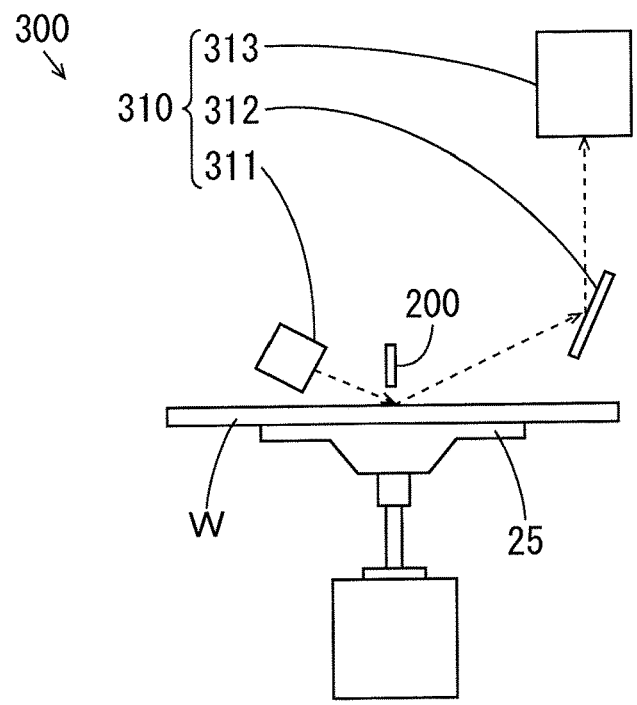
FIG. 6 is a schematic side view of one position detection unit provided in a coating processing unit of FIG. 1.
Figure 7:
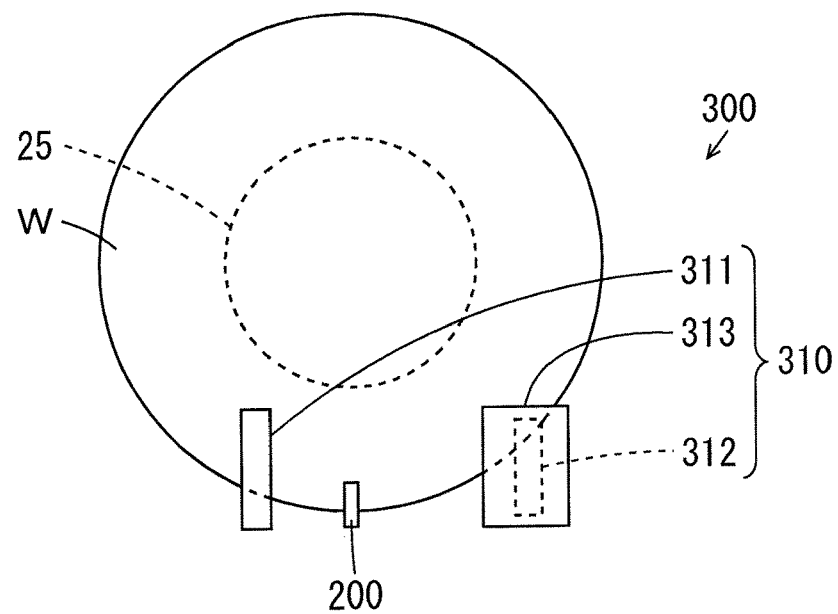
FIG. 7 is a schematic plan view of the position detection unit of FIG. 6.

FIG. 6 is a schematic side view of one position detection unit 300 provided in the coating processing unit 10 of FIG. 1. FIG. 7 is a schematic plan view of the position detection unit 300 of FIG. 6. The configuration of the other position detection unit 300 provided in the coating processing unit 10 is similar to the configuration of the position detection unit 300 of FIGS. 6 and 7.

In the present embodiment, as shown in FIGS. 6 and 7, the position detection unit 300 is constituted by a single imaging device 310. The imaging device 310 includes an illuminator 311, a reflection mirror 312 and a CCD (Charge-Coupled Device) line sensor 313.

The illuminator 311 is arranged at a position above the peripheral portion of the substrate W. The reflection mirror 312 is arranged at a position above the substrate W to be opposite to the illuminator 311 with the nozzle unit 200 interposed therebetween. The CCD line sensor 313 is arranged at a position above the reflection mirror 312. The CCD line sensor 313 is arranged such that pixels are arranged in one row.

Strip-shape light (hereinafter referred to as illumination light) is generated by the illuminator 311. The peripheral portion of the substrate W is irradiated with the illumination light. Further, a lower end of the nozzle unit 200 is irradiated with part of the illumination light. The emitted illumination light is reflected on the substrate W, is further reflected on the reflection mirror 312 and is incident on the CCD line sensor 313.

Thus, images of the peripheral portion of the substrate W and a region in the vicinity of the peripheral portion of the substrate W (hereinafter abbreviated as a peripheral portion region) are picked up, and an image of a lower end of the discharger 212 (FIG. 2) at the lower end of the nozzle unit 200 is picked up. The image data indicating images of the peripheral portion region of the substrate W and the discharger 212 is supplied to the local controller 400 of FIG. 8, described below.

(5) Configuration of Local Controller

FIG. 8 is a block diagram showing the configuration of the local controller 400 for controlling the coating processing unit 10 of FIG. 1. As shown in FIG. 8, the local controller 400 includes a storage 410 and a main controller 420. The storage 410 is constituted by a non-volatile memory or a hard disc, for example. In the storage 410, a program for controlling an operation of the coating processing unit 10 is stored, and various data is stored. Further, the information indicating the preset edge cut width E is stored in the storage 410.

The main controller 420 is constituted by a Central Processing Unit (CPU) and includes a transport controller 421, a rotation controller 422, an imaging controller 423, a substrate position calculator 424, a nozzle position calculator 425, a discharge port determiner 426 and a discharge controller 427. The functions of the transport controller 421, the rotation controller 422, the imaging controller 423, the substrate position calculator 424, the nozzle position calculator 425, the discharge port determiner 426 and the discharge controller 427 are realized by the execution of the program stored in the storage 410 by the main controller 420.

The transport controller 421 controls the nozzle transport device 240 such that the head portion 210 (FIG. 2) of the nozzle unit 200 is moved between the waiting position and the discharge position. The rotation controller 422 controls the spin chuck 25 such that the substrate W is held, rotated or stopped, and controls a rotation speed of the spin chuck 25. Further, an encoder is provided in the spin chuck 25. The rotation controller 422 acquires an output signal from the encoder of the spin chuck 25, and detects a rotation angle of the spin chuck 25 (a rotation angle of the substrate W). A state in which a notch of the substrate W is oriented in a predetermined direction is defined as a reference angle (0 degree), for example. The rotation angle is a rotation angle of the substrate W with respect to the reference angle.

The imaging controller 423 controls the position detection unit 300 such that image data is produced by picking up of images of the peripheral portion region of the substrate W and the discharger 212. Further, the imaging controller 423 acquires the image data indicating the images of the peripheral portion region of the substrate W and the discharger 212 from the position detection unit 300.

The substrate position calculator 424 calculates a position of the outer periphery of the substrate W in the radial direction of the substrate W for each rotation angle based on the rotation angle of the substrate W detected by the rotation controller 422 and the image data acquired by the imaging controller 423. The nozzle position calculator 425 calculates a position of the discharger 212 with respect to the substrate W based on the image data acquired by the imaging controller 423.

A position of each discharge port 213 (FIG. 3) in the discharger 212 is known. Then, the discharge port determiner 426 determines discharge ports 213 from which the rinse liquid is discharged for each rotation angle of the substrate W based on a position of the outer periphery of the substrate W calculated by the substrate position calculator 424 and a position of the discharger 212 calculated by the nozzle position calculator 425. The discharge controller 427 controls the discharger 212 according to the rotation angle of the substrate W detected by the rotation controller 422 such that the rinse liquid is discharged from the discharge ports 213 determined by the discharge port determiner 426, and controls the discharger 212 according to the rotation angle of the substrate W detected by the rotation controller 422 such that the rinse liquid is not discharged from other discharge ports 213.

(6) Operation of Local Controller

Figure 9A:
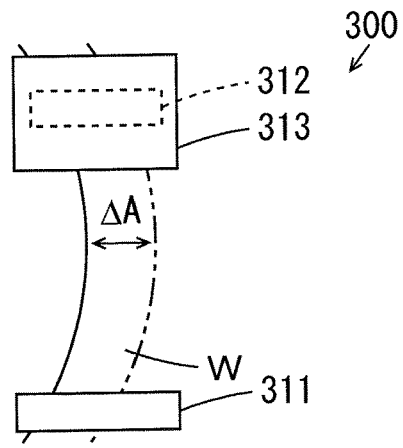
FIGS. 9A to 9C are diagrams for explaining an operation of the local controller of FIG. 8.
Figure 9B:
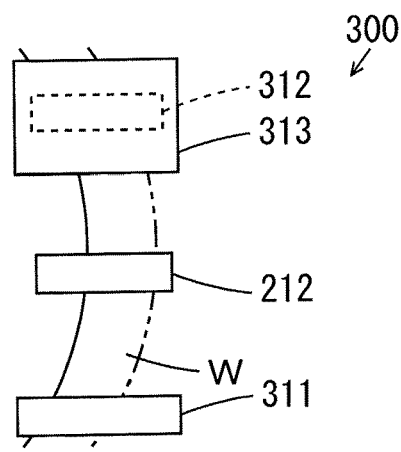
Figure 9C:
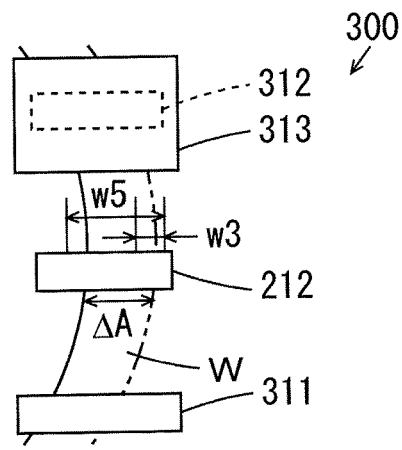

FIGS. 9A to 9C are diagrams for explaining the operation of the local controller 400 of FIG. 8. In each of FIGS. 9A to 9C, the outer periphery of the substrate W that is displaced at the outermost position is indicated by a two-dots and dash line, and the outer periphery of the substrate W that is displaced at the innermost position is indicated by a solid line. As shown in FIG. 9A, an image of the peripheral portion region of the substrate W is picked up by the position detection unit 300 while the substrate W is rotated. Thus, image data indicating the image of the peripheral portion region of the substrate W is produced.

The image data produced by the position detection unit 300 is acquired by the imaging controller 423 (FIG. 8). Thus, a position of the outer periphery of the substrate W for each rotation angle of the substrate W is calculated by the substrate position calculator 424. A difference between the position of the outer periphery of the substrate W displaced at the outermost position and the position of the outer periphery of the substrate W displaced at the innermost position (an amplitude of the displacement of the substrate W) is ΔA. The amplitude ΔA is equivalent to an amount of deviation of the center of the substrate W from the rotational center of the substrate W (the rotational center of the spin chuck 25). A length of the discharge region of the discharger 212 is equal to or larger than a total of the edge cut width E and the above-mentioned amplitude ΔA.

Then, the nozzle transport device 240 of FIG. 8 is controlled by the transport controller 421, whereby the discharger 212 is moved to the discharge position from the waiting portion as shown in FIG. 9B. In this case, the transport controller 421 controls the nozzle transport device 240 such that a row of the plurality of discharge ports 213 of the discharger 212 substantially coincides with the radial direction of the substrate W, and controls the nozzle transport device 240 such that the end discharge port 213A (FIG. 3) of the discharger 212 is located at a position further outward than the position of the outer periphery of the substrate W located at the outermost position. Thus, even in the case where the position of the outer periphery of the substrate W is changed due to the rotation of the substrate W, the discharge region of the discharger 212 is opposite to the peripheral portion of the substrate W.

In this state, images of the peripheral portion region of the rotating substrate W and the discharger 212 are picked up by the position detection unit 300. The image data indicating the images of the peripheral portion region of the substrate W and the discharger 212 are produced.

The image data produced by the position detection unit 300 is acquired by the imaging controller 423. Thus, a position of the discharger 212 with respect to the position of the outer periphery of the substrate W is calculated by the nozzle position calculator 425 (FIG. 8) for each rotation angle of the substrate W. A position of each discharge port 213 (FIG. 3) in the discharger 212 is known, so that a position of each discharge port 213 with respect to the position of the outer periphery of the substrate W is specified for each rotation angle of the substrate W. Thereafter, discharge ports 213 (a discharge region) from which the rinse liquid is to be discharged are determined by the discharge port determiner 426 (FIG. 8) for each rotation angle of the substrate W based on a position of each discharge port 213 with respect to the position of the outer periphery of the substrate W.

Specifically, as shown in FIG. 9C, a discharge region of the discharger 212 in the case where the substrate W is displaced at the outermost position is determined. The discharge region is equivalent to the region having the width w3 of FIG. 5B. Further, a discharge region of the discharger 212 in the case where the substrate W is displaced at the innermost position is determined. The discharge region is equivalent to the region having the width w5 of FIG. 5C. These discharge regions correspond to the discharge ports 213 opposite to the inner edge of the peripheral portion of the substrate W and the discharge ports 213 opposite to a region further outward than the inner edge.

Figure 10A:
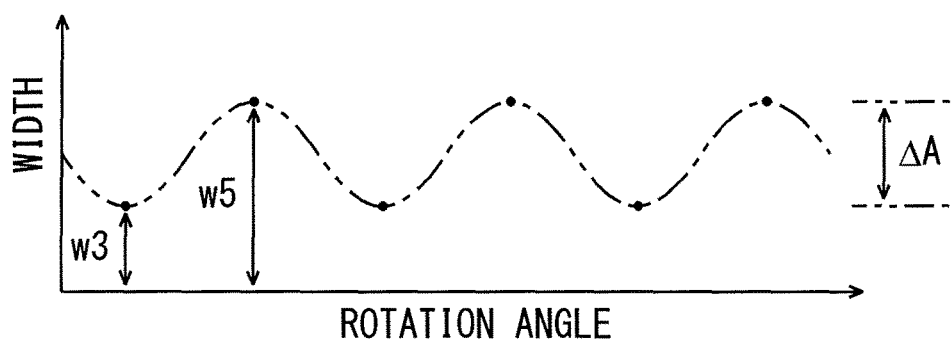
FIGS. 10A to 10C are diagrams for explaining a method of determining a discharge region of a discharger.
Figure 10B:
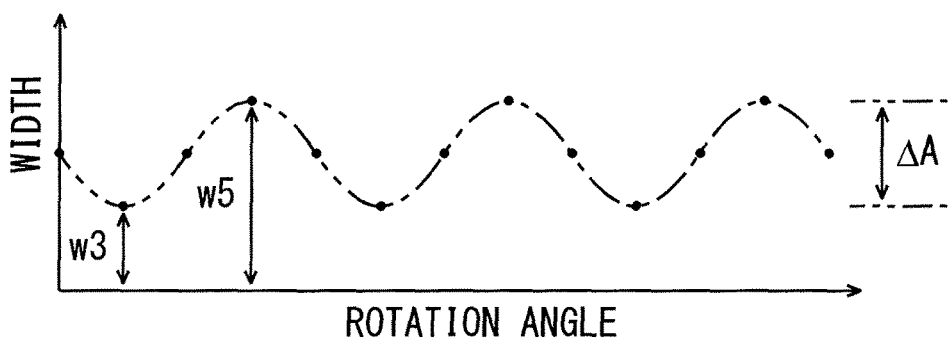
Figure 10C:
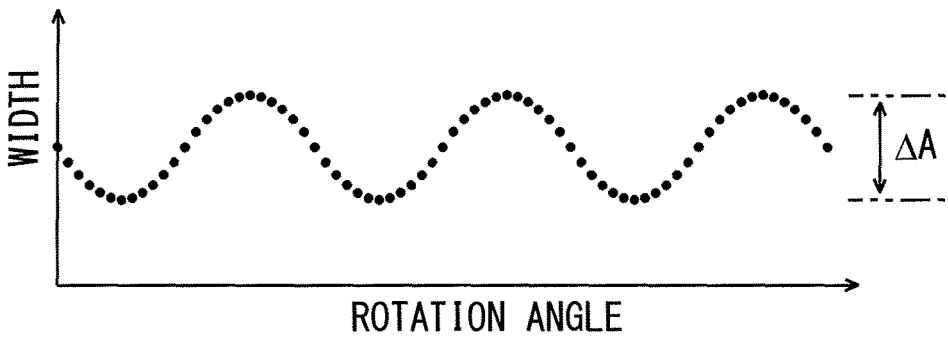

FIGS. 10A to 10C are diagrams for explaining a method of determining the discharge region of the discharger 212. In FIGS. 10A to 10C, the abscissa indicates the rotation angle of the substrate W, and the ordinate indicates the width of the discharge region of the discharger 212. In the example of FIG. 10A, the widths w3, w5 of the discharge region are determined as described above. Thereafter, a relationship between the rotation angle of the substrate W and the width of the discharge region in the case where the position of the outer periphery of the substrate W is displaced between the outermost position and the innermost position is interpolated by a sine wave or a cosine wave by the discharge port determiner 426.

In FIG. 10A, a curve indicating the interpolated width of the discharge region is indicated by a two-dots and dash line. The amplitude of the curve is a difference between the width w3 and the width w5 and equal to the amplitude ΔA of the displacement of the outer periphery of the substrate W. While a relationship between the rotation angle of the substrate W and the width of the discharge region in the case where the outer periphery of the substrate W is displaced at another position is interpolated based on the widths w3, w5 of the two discharge regions in the example of FIG. 10A, the present invention is not limited to this.

In the example of FIG. 10B, a relationship between the rotation angle of the substrate W and the width of the discharge region in the case where the outer periphery of the substrate W is displaced at a middle position between the outermost position and the innermost position is determined in advance by the method similar to the method of determining the widths w3, w5. Thereafter, a relationship between the rotation angle of the substrate W and the width of the discharge region in the case where the outer periphery of the substrate W is displaced at another position is interpolated. In the example of FIG. 10C, a relationship between the rotation angle of the substrate W and the width of the discharge region for each small rotation angle of the substrate W is determined by the method similar to the method of determining the widths w3, w5.

Figure 11:
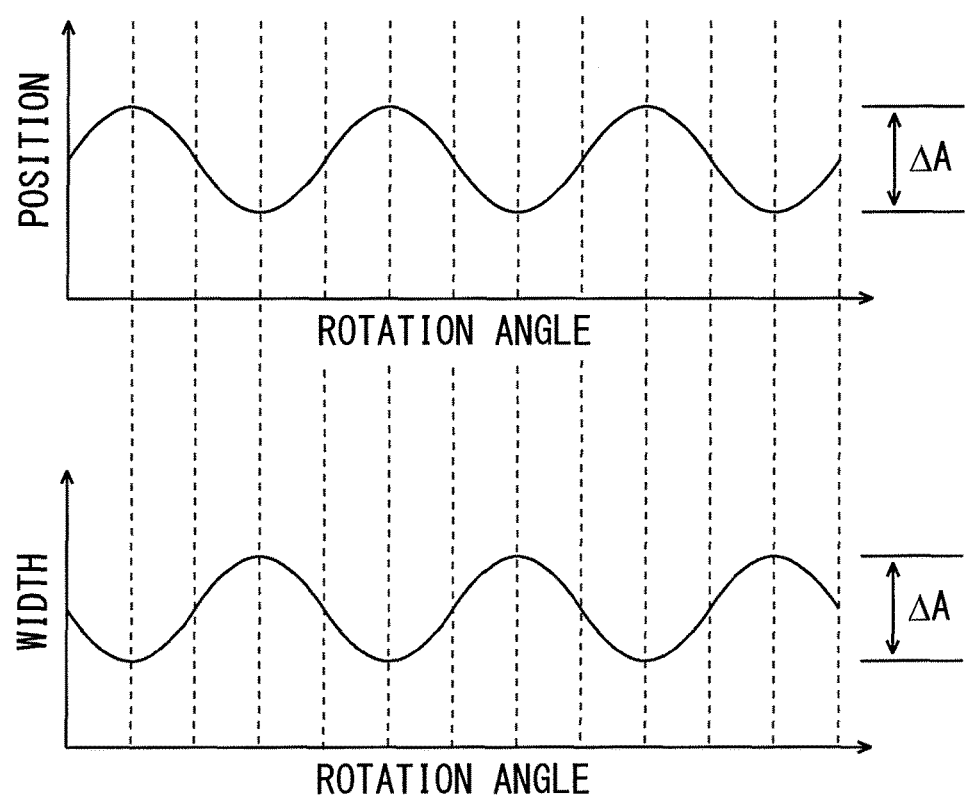
FIG. 11 is a diagram for explaining the control of the discharger.

FIG. 11 is a diagram for explaining the control of the discharger 212. In an upper part of FIG. 11, the abscissa indicates the rotation angle of the substrate W, and the ordinate indicates the position of the outer periphery of the substrate W. The position of the outer periphery of the substrate W is indicated with the rotational center of the spin chuck 25 (FIG. 1) as an original position (O). In a lower part of FIG. 11, the abscissa indicates the rotation angle of the substrate W, and the ordinate indicates the width of the discharge region of the discharger 212. The width of the discharge region of the discharger 212 is indicated with a position of the end discharge port 213A in the longitudinal direction of the discharger 212 as an original position (O).

Hereinafter, a curve indicating the change in position of the outer periphery of the substrate W in the upper part of FIG. 11 is referred to as a position change curve, and a curve indicating the width of the discharge region of the discharger 212 in the lower part of FIG. 11 is referred to as a width change curve. As shown in FIG. 11, the discharger 212 is controlled by the discharge controller 427 (FIG. 8) such that the rinse liquid is discharged from the discharge ports 213 (FIG. 3) in the discharge region. The rinse liquid is discharged from the discharge ports 213 (FIG. 3) in the discharge region such that a phase difference between the width change curve and the position change curve is Tr. In this case, the discharge controller 427 controls the discharger 212 such that the change in width of the discharge region of the discharger 212 is synchronized with the rotation angle of the substrate W. Thus, even in the case where the center of the substrate W deviates from the rotational center of the substrate W, the width of the portion of the coating film F to be removed is constant.

(7) Peripheral Portion Processing

Figure 12:
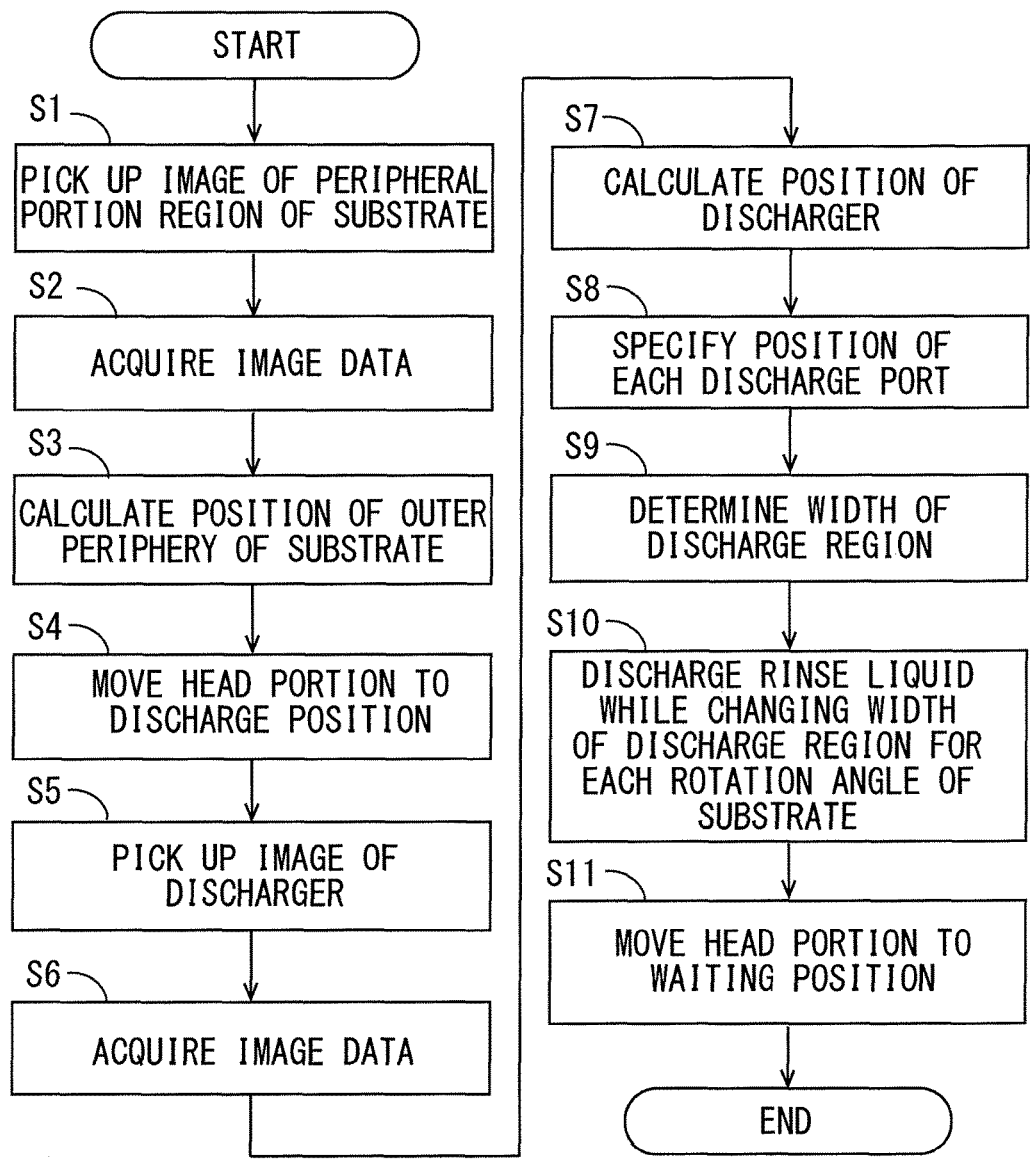
FIG. 12 is a flow chart showing peripheral portion processing for processing a peripheral portion of the substrate.

FIG. 12 is a flow chart showing the peripheral portion processing for processing the peripheral portion of the substrate W. The peripheral portion processing by the main controller 420 of the local controller 400 will be described below with reference to FIG. 8. The peripheral portion processing is performed with the substrate W continuously rotated by the spin chuck 25 immediately after the formation of the coating film on the substrate W.

First, the main controller 420 picks up an image of the peripheral portion region of the rotating substrate W by the position detection unit 300 (step S1). Next, the main controller 420 acquires the produced image data (step S2). Subsequently, the main controller 420 calculates the position of the outer periphery of the substrate W for each rotation angle based on the acquired image data (step S3).

Then, the main controller 420 moves the head portion 210 (FIG. 2) from the waiting position to the discharge position by the nozzle transport device 240 (step S4). In this state, the main controller 420 picks up an image of the discharger 212 of the head portion 210 by the position detection unit 300 together with the peripheral portion region of the rotating substrate W (step S5). Subsequently, the main controller 420 acquires the produced image data (step S6). Thereafter, the main controller 420 calculates the position of the discharger 212 with respect to the outer periphery of the substrate W based on the acquired image data (step S7).

Then, the main controller 420 specifies a position of each discharge port 213 (FIG. 3) of the discharger 212 with respect to the substrate W (step S8). Subsequently, the main controller 420 determines the width of the discharge region of the discharger 212 for each rotation angle of the substrate W based on the position of the outer periphery of the substrate W, the position of each discharge port 213 of the discharger 212 with respect to the substrate W and the preset edge cut width E (step S9).

Thereafter, the main controller 420 allows the rinse liquid to be discharged from one or more discharge ports 213 corresponding to the discharge region of the discharger 212 while changing the width of the discharge region for each rotation angle of the substrate W (step S10). The substrate W is rotated a predetermined number of times, which is one or more times, while the discharger 212 discharges the rinse liquid, and then the main controller 420 allows the head portion 210 to be moved from the discharge position to the waiting position by the nozzle transport device 240 (step S11) and ends the processing.

(8) Configuration of Substrate Processing Apparatus

Figure 13:
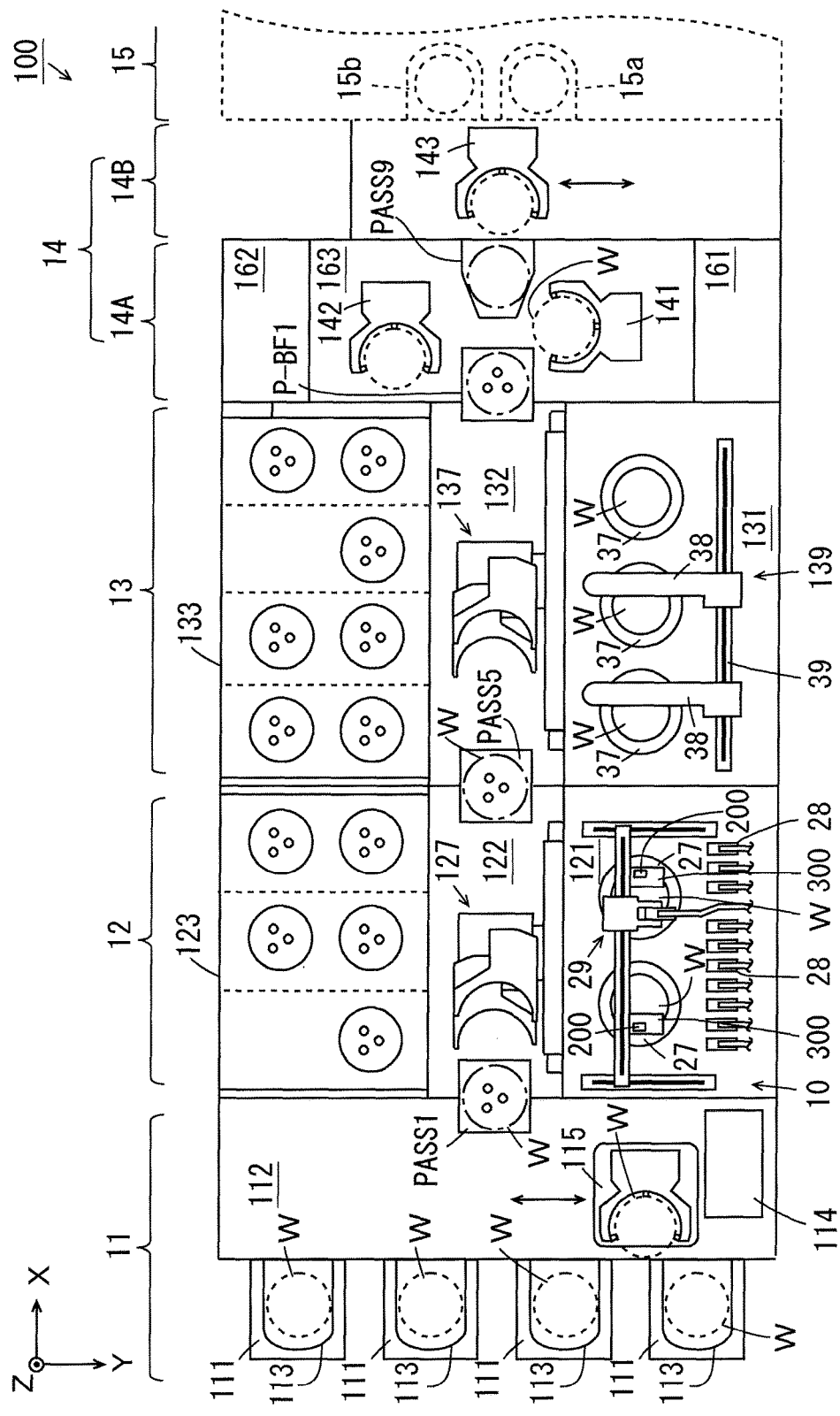
FIG. 13 is a schematic plan view of a substrate processing apparatus including the coating processing unit of FIG. 1.

FIG. 13 is a schematic plan view of the substrate processing apparatus including the coating processing unit 10 of FIG. 1. In FIG. 13 and subsequent given drawings are accompanied by arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 13, the substrate processing apparatus 100 includes an indexer block 11, a coating block 12, a development block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B.

The indexer block 11 includes a plurality of carrier platforms 111 and a transport section 112. In each carrier platform 111, a carrier 113 for storing the plurality of substrates W in multiple stages is placed. In the transport section 112, a main controller 114 and a transport device (a transport robot) 115 are provided. The main controller 114 controls various constituent elements of the substrate processing apparatus 100. The transport device 115 holds and transports the substrate W.

The coating block 12 includes a coating processing section 121, a transport section 122 and a thermal processing section 123. The coating processing section 121 and the thermal processing section 123 are opposite to each other with the transport section 122 interposed therebetween. Substrate platforms PASS1 to PASS4 (see FIG. 16) on which the substrates W are placed are provided between the transport section 122 and the indexer block 11. Transport devices 127, 128 (see FIG. 16), which transport the substrates W, are provided in the transport section 122.

The development block 13 includes a development processing section 131, a transport section 132 and a thermal processing section 133. The development processing section 131 and the thermal processing section 133 are opposite to each other with the transport section 132 interposed therebetween. Substrate platforms PASS5 to PASS8 (see FIG. 16) on which the substrates W are placed are provided between the transport section 132 and the transport section 122. Transport devices 137, 138 (see FIG. 16), which transport the substrates W, are provided in the transport section 132.

The cleaning drying processing block 14A includes cleaning drying processing sections 161, 162 and a transport section 163. The cleaning drying processing sections 161, 162 are opposite to each other with the transport section 163 interposed therebetween. Transport devices 141, 142 are provided in the transport section 163.

Placement buffer units P-BF1, P-BF2 (see FIG. 16) are provided between the transport section 163 and the transport section 132. The placement buffer units P-BF1, P-BF2 are configured to be capable of storing the plurality of substrates W.

Further, a substrate platform PASS9, and below-mentioned placement cooling units P-CP (see FIG. 16) are provided to be adjacent to the carry-in carry-out block 14B between the transport devices 141, 142. Each placement cooling unit P-CP includes a function of cooling the substrate W (a cooling plate, for example). In the placement cooling unit P-CP, the substrate W is cooled to a temperature suitable for exposure processing.

A transport device 143 is provided in the carry-in carry-out block 14B. The transport device 143 carries in the substrate W to and carries out the substrate W from the exposure device 15. A substrate inlet 15a for carrying in the substrate W and a substrate outlet 15b for carrying out the substrate W are provided in the exposure device 15.

(9) Coating Processing Section and Development Processing Section

Figure 14:
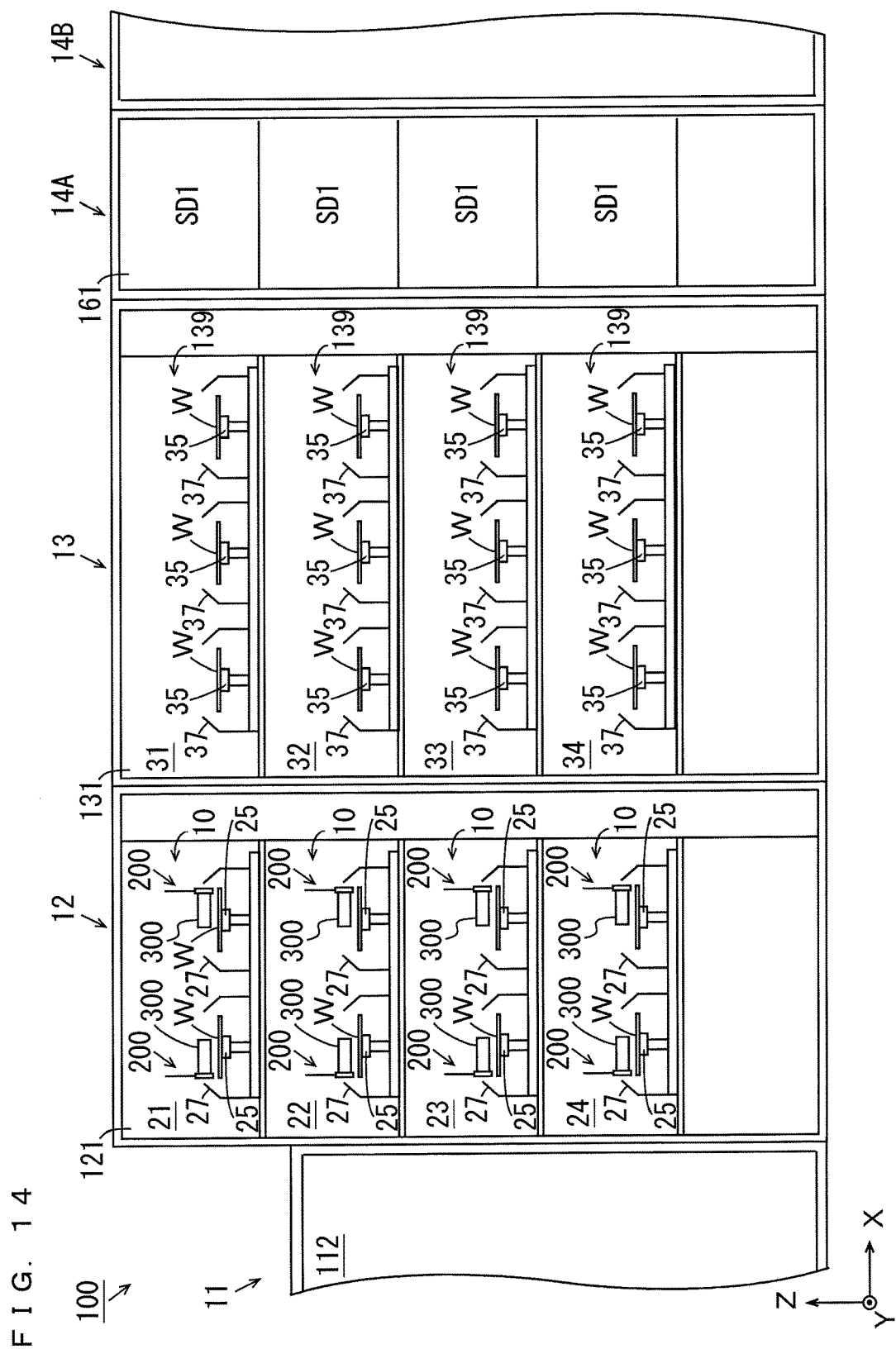
FIG. 14 is a schematic side view showing inner configurations of a coating processing section, a development processing section and a cleaning drying processing section of FIG. 13.

FIG. 14 is a schematic side view showing the inner configurations of the coating processing section 121, the development processing section 131 and the cleaning drying processing section 161 of FIG. 13. As shown in FIG. 14, coating processing chambers 21, 22, 23, 24 are provided in a stack in the coating processing section 121. In each of the coating processing chambers 21 to 24, a coating processing unit 10 of FIG. 1 is provided. In the development processing section 131, development processing chambers 31, 32, 33, 34 are provided in a stack. In each of the development processing chambers 31 to 34, a development processing unit 139 (a spin developer) is provided.

In the present embodiment, a coating liquid for an anti-reflection film (an anti-reflection liquid) is discharged from a coating liquid nozzle 28 in the coating processing unit 10 in each of the coating processing chambers 22, 24. A coating liquid for a resist film (a resist liquid) is discharged from a coating liquid nozzle 28 in the coating processing unit 10 in each of the coating processing chambers 21, 23.

Each development processing unit 139 includes a plurality of spin chucks 35 and a plurality of cups 37 similarly to the coating processing unit 10. Further, as shown in FIG. 13, the development processing unit 139 includes two slit nozzles 38 for discharging the development liquid and a moving device 39 for moving these slit nozzles 38.

In the development processing unit 139, a spin chuck 35 is rotated by a driving device (not shown). Thus, the substrate W is rotated. In this state, the slit nozzle 38 supplies the development liquid to each substrate W while moving. Thus, the development processing for the substrate W is performed.

A plurality (four in the present example) of cleaning drying processing units SD1 are provided in the cleaning drying processing section 161. In each of the cleaning drying processing units SD1, cleaning and drying processing for the substrate W on which the exposure processing has not been performed are performed.

(10) Thermal Processing Section

Figure 15:
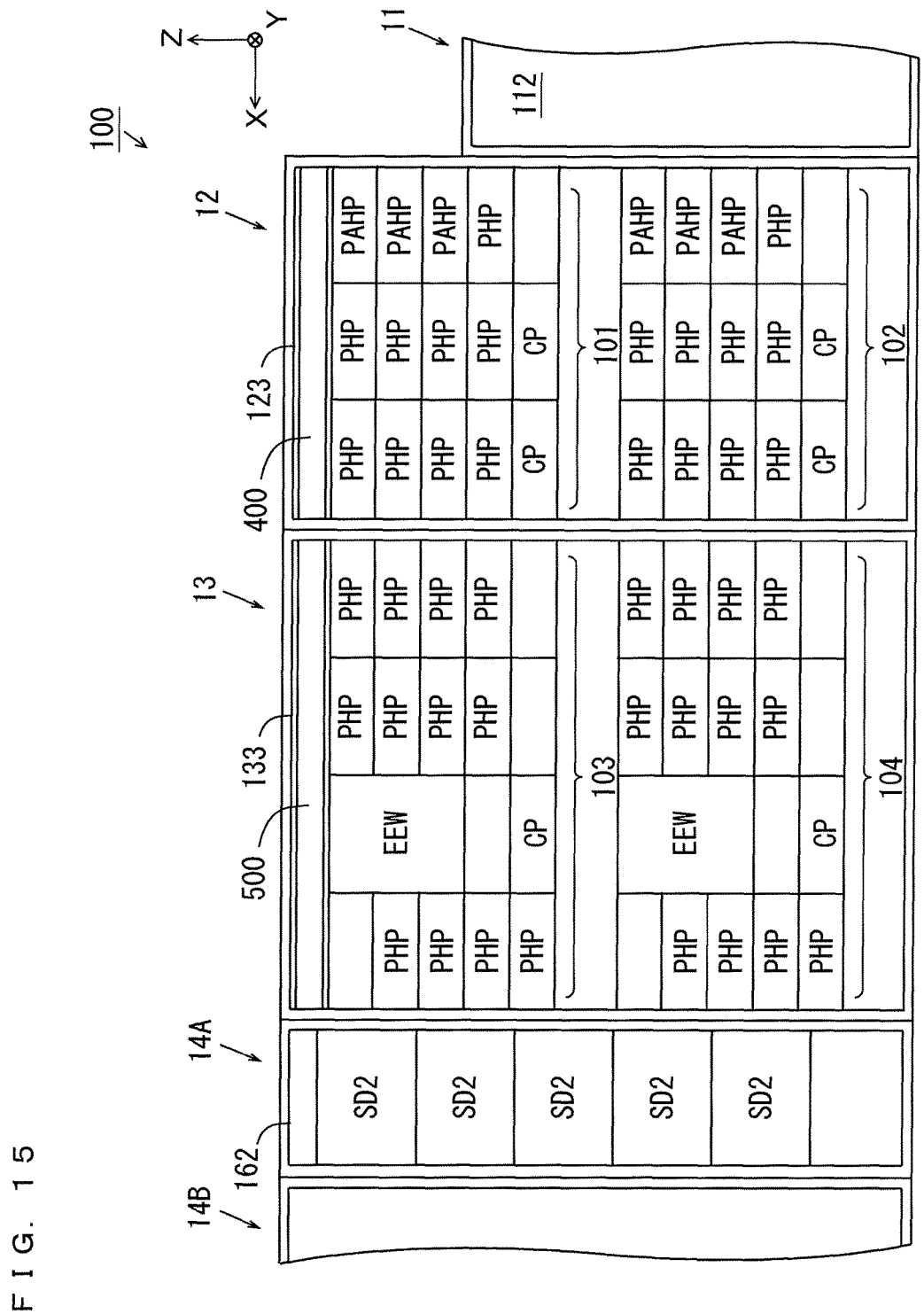
FIG. 15 is a schematic side view showing inner configurations of thermal processing sections and the cleaning drying processing section of FIG. 13.

FIG. 15 is a schematic side view showing the inner configurations of the thermal processing sections 123, 133 and the cleaning drying processing section 162 of FIG. 13. As shown in FIG. 15, the thermal processing section 123 has an upper thermal processing section 101 provided above, and a lower thermal processing section 102 provided below. In each of the upper thermal processing section 101 and the lower thermal processing section 102, a plurality of thermal processing units PHP, a plurality of adhesion reinforcement processing units PAHP and a plurality of cooling units CP are provided.

A local controller 400 of FIG. 8 is provided at the top of the thermal processing section 123. The local controller 400 controls the operations of the coating processing section 121, the transport section 122 and the thermal processing section 123 based on instructions from the main controller 114 of FIG. 13.

In the thermal processing unit PHP, heating processing and cooling processing for the substrate W are performed. Adhesion reinforcement processing for improving adhesion between the substrate W and the anti-reflection film is performed in the adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section 103 provided above and a lower thermal processing section 104 provided below. A cooling unit CP, a plurality of thermal processing units PHP and an edge exposure unit EEW are provided in each of the upper thermal processing section 103 and the lower thermal processing section 104.

A local controller 500 is provided at the top of the thermal processing section 133. The local controller 500 controls operations of the development processing section 131, the transport section 132 and the thermal processing section 133 based on instructions from the main controller 114 of FIG. 13.

In each edge exposure unit EEW, the exposure processing for the peripheral portion of the substrate W (edge exposure processing) is performed. The edge exposure processing is performed on the substrate W, whereby the resist film on the peripheral portion of the substrate W is removed during the subsequent development processing. Thus, in the case where the peripheral portion of the substrate W comes into contact with another portion after the development processing, the resist film on the peripheral portion of the substrate W is prevented from being stripped off and becoming particles.

A plurality (five in the present example) of cleaning drying processing units SD2 are provided in the cleaning drying processing section 162. In each of the cleaning drying processing units SD2, cleaning and drying processing for the substrate W on which the exposure processing has been performed are performed.

(11) Transport Section

Figure 16:
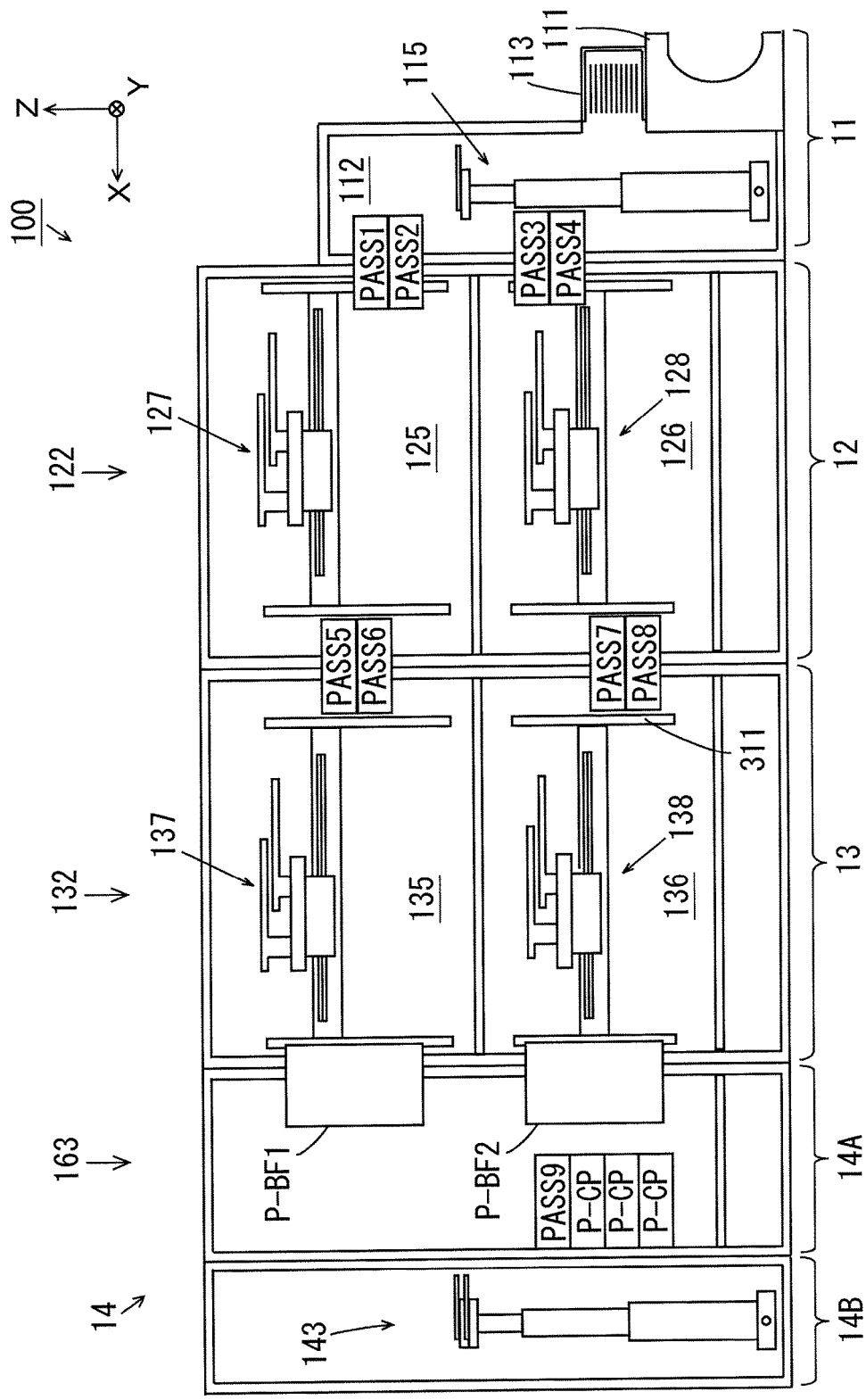
FIG. 16 is a schematic side view showing inner configurations of transport sections.

FIG. 16 is a schematic side view showing the inner configurations of the transport sections 122, 132, 163. As shown in FIG. 16, the transport section 122 has an upper transport chamber 125 and a lower transport chamber 126. The transport section 132 has an upper transport chamber 135 and a lower transport chamber 136. The transport device 127 is provided in the upper transport chamber 125, and the transport device 128 is provided in the lower transport chamber 126. Further, the transport device 137 is provided in the upper transport chamber 135, and the transport device 138 is provided in the lower transport chamber 136.

The substrate platforms PASS1, PASS2 are provided between the transport section 112 and the upper transport chamber 125, and the substrate platform PASS3, PASS4 are provided between the transport section 112 and the lower transport chamber 126. Substrate platforms PASS5, PASS6 are provided between the upper transport chamber 125 and the upper transport chamber 135, and substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided to be adjacent to the carry-in carry-out block 14B in the transport section 163.

The placement buffer unit P-BF1 is configured such that the substrate W can be carried into and carried out from the placement buffer unit P-BF1 by the transport device 137 and the transport devices 141, 142 (FIG. 13). The placement buffer unit P-BF2 is configured such that the substrate W can be carried into and carried out from the placement buffer unit P-BF2 by the transport device 138 and the transport devices 141, 142 (FIG. 13). Further, the substrate platform PASS9 and the placement cooling units P-CP are configured such that the substrate W can be carried into and carried out from the substrate platform PASS9 and the placement cooling units P-CP by the transport devices 141, 142 (FIG. 13) and the transport device 143.

The transport device 127 receives the substrate W from and transfers the substrate W to the coating processing chambers 21, 22 (FIG. 14), the substrate platforms PASS1, PASS2, PASS5, PASS6 (FIG. 16) and the upper thermal processing section 101 (FIG. 15). The transport device 128 receives the substrate W from and transfers the substrate W to the coating processing chambers 23, 24 (FIG. 14), the substrate platforms PASS3, PASS4, PASS7, PASS8 (FIG. 16) and the lower thermal processing section 102 (FIG. 15).

The transport device 137 receives the substrate W from and transfers the substrate W to the development processing chambers 31, 32 (FIG. 14), the substrate platforms PASS5, PASS6 (FIG. 16), the placement buffer unit P-BF1 (FIG. 16) and the upper thermal processing section 103 (FIG. 15). The transport device 138 receives the substrate W from and transfers the substrate W to the development processing chambers 33, 34 (FIG. 14), the substrate platforms PASS7, PASS8 (FIG. 16), the placement buffer unit P-BF2 (FIG. 16) and the lower thermal processing section 104 (FIG. 15).

(12) Substrate Processing

The substrate processing will be described with reference to FIGS. 13 to 16. Each carrier 113 in which unprocessed substrates W are stored is placed on each carrier platform 111 (FIG. 13) in the indexer block 11. The transport device 115 transports the unprocessed substrate W from the carrier 113 to either of the substrate platforms PASS1, PASS3 (FIG. 16). Further, the transport device 115 transports the processed substrate W that is placed on either of the substrate platforms PASS2, PASS4 (FIG. 16) to the carrier 113.

In the coating block 12, the transport device 127 (FIG. 16) sequentially transports the unprocessed substrate W that is placed on the substrate platform PASS1 to the adhesion reinforcement processing unit PAHP (FIG. 15), the cooling unit CP (FIG. 15) and the coating processing chamber 22 (FIG. 14). Next, the transport device 127 sequentially transports the substrate W in the coating processing chamber 22 to the thermal processing unit PHP (FIG. 15), the cooling unit CP (FIG. 15), the coating processing chamber 21 (FIG. 14), the thermal processing unit PHP (FIG. 15) and the substrate platform PASS5 (FIG. 16).

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, in the coating processing chamber 22, the anti-reflection film is formed on the substrate W, and the anti-reflection film at the peripheral portion of the substrate W is removed, by the coating processing unit 10 (FIG. 14). Subsequently, the thermal processing for the substrate W is performed in the thermal processing unit PHP, and then the substrate W is cooled in the cooling unit CP to a temperature suitable for the formation of the resist film. Then, in the coating processing chamber 21, the resist film is formed on the substrate W, and the resist film at the peripheral portion of the substrate W is removed, by the coating processing unit 10 (FIG. 14). Thereafter, the thermal processing for the substrate W is performed in the thermal processing unit PHP, and the substrate W is placed on the substrate platform PASS5.

Further, the transport device 127 transports the substrate W on which the development processing has been performed and which is placed on the substrate platform PASS6 (FIG. 16) to the substrate platform PASS2 (FIG. 16).

The transport device 128 (FIG. 16) sequentially transports the unprocessed substrate W that is placed on the substrate platform PASS3 to the adhesion reinforcement processing unit PAHP (FIG. 15), the cooling unit CP (FIG. 15) and the coating processing chamber 24 (FIG. 14). Next, the transport device 128 sequentially transports the substrate W in the coating processing chamber 24 to the thermal processing unit PHP (FIG. 15), the cooling unit CP (FIG. 15), the coating processing chamber 23 (FIG. 14), the thermal processing unit PHP (FIG. 15) and the substrate platform PASS7 (FIG. 16).

Further, the transport device 128 (FIG. 16) transports the substrate W on which the development processing has been performed and which is placed on the substrate platform PASS8 (FIG. 16) to the substrate platform PASS4 (FIG. 16). The contents of processing for the substrate W in the coating processing chambers 23, 24 (FIG. 14) and the lower thermal processing section 102 (FIG. 15) are respectively similar to the contents of processing for the substrate W in the above-mentioned coating processing chambers 21, 22 (FIG. 14) and the upper thermal processing section 101 (FIG. 15).

In the development block 13, the transport device 137 (FIG. 16) sequentially transports the substrate W on which the resist film is formed and which is placed on the substrate platform PASS5 to the edge exposure unit EEW (FIG. 15) and the placement buffer unit P-BF1 (FIG. 16). In this case, the edge exposure processing is performed on the substrate W in the edge exposure unit EEW. The substrate W on which the edge exposure processing has been performed is placed on the placement buffer unit P-BF1.

Further, the transport device 137 (FIG. 16) takes out the substrate W on which the exposure processing and the thermal processing have been performed from the thermal processing unit PHP (FIG. 15) adjacent to the cleaning drying processing block 14A. The transport device 137 sequentially transports the substrate W to the cooling unit CP (FIG. 15), one of the development processing chambers 31, 32 (FIG. 14), the thermal processing unit PHP (FIG. 15) and the substrate platform PASS6 (FIG. 16).

In this case, the substrate W is cooled in the cooling unit CP to a temperature suitable for the development processing, and then the development processing for the substrate W is performed by the development processing unit 139 in one of the development processing chambers 31, 32. Thereafter, the thermal processing for the substrate W is performed in the thermal processing unit PHP, and the substrate W is placed on the substrate platform PASS6.

The transport device 138 (FIG. 16) sequentially transports the substrate W on which the resist film is formed and which is placed on the substrate platform PASS7 to the edge exposure unit EEW (FIG. 15) and the placement buffer unit P-BF2 (FIG. 16).

Further, the transport device 138 (FIG. 16) takes out the substrate W on which the exposure processing and the thermal processing have been performed from the thermal processing unit PHP (FIG. 15) adjacent to the cleaning drying processing block 14A. The transport device 138 sequentially transports the substrate W to the cooling unit CP (FIG. 15), one of the development processing chambers 33, 34 (FIG. 14), the thermal processing unit PHP (FIG. 15) and the substrate platform PASS8 (FIG. 16). The contents of processing for the substrate W in the development processing chambers 33, 34 and the lower thermal processing section 104 are respectively similar to the contents of processing for the substrate W in the above-mentioned development processing chambers 31, 32 and the upper thermal processing section 103.

In the cleaning drying processing block 14A, the transport device 141 (FIG. 13) sequentially transports the substrate W that is placed on either of the placement buffer units P-BF1, P-BF2 (FIG. 16) to the cleaning drying processing unit SD1 (FIG. 14) and the placement cooling unit P-CP (FIG. 16). In this case, cleaning and drying processing for the substrate W are performed in the cleaning drying processing unit SD1, and then the substrate W is cooled in the placement cooling unit P-CP to a temperature suitable for the exposure processing by the exposure device 15 (FIG. 13).

The transport device 142 (FIG. 13) sequentially transports the substrate W on which the exposure processing has been performed and which is placed on the substrate platform PASS9 (FIG. 16) to the cleaning drying processing unit SD2 (FIG. 15) and the thermal processing unit PHP (FIG. 15) in the upper thermal processing section 103 or the lower thermal processing section 104. In this case, the cleaning and drying processing for the substrate W are performed in the cleaning drying processing unit SD2, and then the post-exposure bake (PEB) processing is performed in the thermal processing unit PHP.

In the carry-in carry-out block 14B, the transport device 143 (FIG. 13) transports the substrate W on which the exposure processing has not been performed and which is placed on the placement cooling unit P-CP (FIG. 16) to the substrate inlet 15a (FIG. 13) in the exposure device 15. Further, the transport device 143 (FIG. 13) takes out the substrate W on which the exposure processing has been performed from the substrate outlet 15b (FIG. 13) in the exposure device 15 and transports the substrate W to the substrate platform PASS9 (FIG. 16).

In the present embodiment, the processing for the substrates W in the coating processing chambers 21, 22, the development processing chambers 31, 32 and the upper thermal processing sections 101, 103 provided above, and the processing for the substrates W in the coating processing chambers 23, 24, the development processing chambers 33, 34 and the lower thermal processing sections 102, 104 provided below can be concurrently performed. Thus, it is possible to improve the throughput without increasing a footprint.

(13) Effects

In the coating processing unit 10 according to the present embodiment, the rinse liquid is discharged from the discharger 212 to the substrate W rotated by the spin chuck 25. The discharger 212 has the plurality of discharge ports 213 arranged in the one direction and can selectively discharge the rinse liquid from the plurality of respective discharge ports 213. With the row of the plurality of discharge ports 213 of the discharger 212 crossing and facing the peripheral portion of the substrate W rotated by the spin chuck 25, the rinse liquid is supplied to a position further outward than the inner edge of the peripheral portion.

In this configuration, the rinse liquid is not supplied from the discharger 212 to a position further inward than the inner edge of the peripheral portion of the substrate W. Further, it is not necessary to discharge the rinse liquid at a high pressure when the rinse liquid is supplied to a position further outward than the inner edge of the peripheral portion of the substrate W. Therefore, rebounding of the rinse liquid from the one surface of the substrate W is reduced, and the rinse liquid is prevented from rebounding to a position further inward than the inner edge of the peripheral portion of the substrate W. Thus, generation of a protrusion at the outer periphery of the coating film F after the removal that is indicated by the two-dots and dash line in FIG. 4C is prevented. As a result, the processing for the peripheral portion of the substrate W can be performed with high accuracy.

(14) Other Embodiments (a) In the above-mentioned embodiment, as shown in the examples of FIGS. 4C, 5B and 5C, the rinse liquid is discharged from the discharge ports 213 that are opposite to a region further outward than the outer periphery of the substrate W during the removal of the coating film at the peripheral portion of the substrate W. However, the present invention is not limited to this. It is not necessary to discharge the rinse liquid from the discharge ports 213 located at positions further outward than the outer periphery of the substrate W. Therefore, during the removal of the coating film at the peripheral portion of the substrate W, the rinse liquid does not have to be discharged from the discharge ports 213 that are opposite to the region located at a position further outward than the outer periphery of the substrate W. In this case, it is possible to reduce the consumption of the rinse liquid with no influence to the processing for the peripheral portion of the substrate W.

(b) While the plurality of discharge ports 213 are formed in the bottom surface 212F of the discharger 212 to be arranged in two rows in the longitudinal direction in the above-mentioned embodiment, the present invention is not limited to this. The plurality of discharge ports 213 may be formed in the bottom surface 212F of the discharger 212 to be arranged in one row in the longitudinal direction, or the plurality of discharge ports 213 may be formed in the bottom surface 212F of the discharger 212 to be arranged in three or more rows in the longitudinal direction.

(c) While the head portion 210 is arranged such that the row of the plurality of discharge ports 213 of the discharger 212 substantially coincides with the radial direction of the substrate W during the removal of the coating film at the peripheral portion of the substrate W in the above-mentioned embodiment, the present invention is not limited to this. During the removal of the coating film at the peripheral portion of the substrate W, the head portion 210 may be arranged such that the row of the plurality of discharge ports 213 of the discharger 212 is inclined with respect to the radial direction of the substrate W.

(d) While the position detection unit 300 is constituted by the common imaging device 310 that detects the position of the outer periphery of the substrate W and the position of the discharger 212 in the above-mentioned embodiment, the present invention is not limited to this. The position detection unit 300 may be constituted by two imaging devices 310 that respectively detect a position of the outer periphery of the substrate W and a position of the discharger 212. In this case, the flexibility of the arrangement of the nozzle unit 200 can be improved with no restriction on a positional relationship between the outer periphery of the substrate W and the nozzle unit 200.

(e) While the head portion 210 has the piezoelectric type discharger 212 in which the discharge of the removal liquid from the plurality of respective discharge ports 213 is independently controlled by the piezoelectric element in the above-mentioned embodiment, the present invention is not limited to this. If the discharge of the removal liquid from the plurality of respective discharge ports 213 can be independently controlled, the head portion 210 may have the discharger 212 of another type such as a thermal type.

(f) While the imaging device 310 of the position detection unit 300 is constituted by a reflective type photoelectric sensor in the above-mentioned embodiment, the present invention is not limited to this. The imaging device 310 may be constituted by a transmission type photoelectric sensor.

(g) While the imaging device 310 includes the reflection mirror 312 in the above-mentioned embodiment, the present invention is not limited to this. The imaging device 310 does not have to include the reflection mirror 312. In this case, the CCD line sensor 313 is arranged to directly detect the light reflected from the upper surface of the substrate W.

(h) While processing for removing the anti-reflection liquid or the resist liquid applied to the peripheral portion of the substrate W is performed as the peripheral portion processing in the above-mentioned embodiment, the present invention is not limited to this. The processing for forming a film of the coating liquid at the peripheral portion of the substrate W may be performed as the peripheral portion processing.

For example, contaminants are sometimes likely to adhere to the peripheral portion of the substrate W due to the roughness of the surface at the peripheral portion of the substrate W. In such a case, a film of the coating liquid is formed at the peripheral portion of the substrate W, whereby the peripheral portion of the substrate W is coated. Thus, an adherence of contaminants to the peripheral portion of the substrate W can be prevented.

(15) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the coating processing unit 10 is an example of a peripheral portion processing device, the spin chuck 25 is an example of a rotation holder, and the discharge port 213 is an example of a discharge port. The discharger 212 is an example of a discharger, the discharge controller 427 is an example of a discharge controller, the position detection unit 300, the substrate position calculator 424 and the nozzle position calculator 425 are examples of a position change detector. The discharge port determiner 426 is an example of a discharge port determiner, the nozzle position calculator 425 is an example of a positional relationship detector, the nozzle transport device 240 is an example of a mover, and the transport controller 421 is an example of a mover controller.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for peripheral portion processing for a substrate using various types of processing liquids.

I claim:

1. A peripheral portion processing device that performs processing on an annular peripheral portion extending along an outer periphery of one surface of a substrate at least partially having a circular outer periphery, comprising:
   a rotation holder that holds and rotates the substrate;
   a discharger that has a plurality of discharge ports arranged in one direction and is configured to be capable of selectively discharging a processing liquid from the plurality of respective discharge ports; and
   a discharge controller that, during the processing of the peripheral portion, selects discharge ports from which the processing liquid is to be discharged, and selects discharge ports from which the processing liquid is not to be discharged, such that, with a row of the plurality of discharge ports of the discharger crossing and facing the peripheral portion of the substrate rotated by the rotation holder, the processing liquid is not supplied to a position further inward than an inner edge of the peripheral portion and is supplied to a position further outward than the inner edge of the peripheral portion,
   wherein the discharge controller controls discharge of the processing liquid from the plurality of discharge ports of the discharger such that the processing liquid is discharged from the discharge ports selected to discharge the processing liquid, and the processing liquid is not discharged from the discharge ports selected not to discharge the processing liquid,
   wherein a length of the discharger in the one direction, in which the plurality of discharge ports are arranged, is smaller than a radius of the substrate, and
   the discharger, during the processing of the peripheral portion, does not move, but stands still with part of the discharger overlapping the peripheral portion of the substrate in a vertical direction and another part of the discharger not overlapping the peripheral portion of the substrate.

2. The peripheral portion processing device according to claim 1, further comprising:
   a position change detector that detects a change in position of the outer periphery of the substrate rotated by the rotation holder; and
   a discharge port determiner that, based on the change in position of the outer periphery of the substrate detected by the position change detector, determines a relationship between a rotation angle of the substrate held by the rotation holder and one or more discharge ports, from which the processing liquid is to be discharged, of the plurality of discharge ports, wherein
   the discharge controller allows the processing liquid to be discharged from the one or more discharge ports of the plurality of discharge ports of the discharger based on the rotation angle of the substrate rotated by the rotation holder and the relationship determined by the discharge port determiner.

3. The peripheral portion processing device according to claim 2, wherein
   the position change detector includes a positional relationship detector that detects a relationship between the position of the outer periphery of the substrate rotated by the rotation holder and positions of the plurality of discharge ports of the discharger for each rotation angle of the substrate, and
   the discharge port determiner determines a relationship between the rotation angle of the substrate held by the rotation holder and the one or more discharge ports, from which the processing liquid is to be discharged, of the plurality of discharge ports based on the relationship detected by the positional relationship detector.

4. The peripheral portion processing device according to claim 3, wherein
   the positional relationship detector produces image data indicating images of the outer periphery of the substrate and the discharger, and detects a relationship between the position of the outer periphery of the substrate and the positions of the plurality of discharge ports of the discharger based on the produced image data.

5. The peripheral portion processing device according to claim 2, wherein
   the discharge port determiner determines a discharge port that is opposite to the inner edge of the peripheral portion of the substrate and a discharge port that is opposite to a region located at a position further outward than the inner edge of the peripheral portion of the substrate as the one or more first discharge ports, from which the processing liquid is to be discharged, of the plurality of discharge ports, and the discharge controller allows the processing liquid to be discharged from the one or more first discharge ports determined by the discharge port determiner.

6. The peripheral portion processing device according to claim 5, wherein the discharge port determiner determines a periodic curve indicating the change in position of the outer periphery of the substrate rotated by the rotation holder, and determines the one or more first discharge ports based on the periodic curve.

7. The peripheral portion processing device according to claim 2, wherein the discharge port determiner determines a discharge port located at a position further outward than the outer periphery of the substrate as one or more second discharge ports, from which the processing liquid is not to be discharged, of the plurality of discharge ports based on a relationship detected by the position change detector, and the discharge controller does not allow the processing liquid to be discharged from the one or more second discharge ports determined by the discharge port determiner.

8. The peripheral portion processing device according to claim 2, further comprising:

a mover that moves the discharger to a position opposite to the peripheral portion of the substrate held by the rotation holder; and a mover controller that controls an operation of the mover, wherein the mover controller controls the mover based on the change in position of the outer periphery of the substrate detected by the position change detector such that the row of the plurality of discharge ports crosses the peripheral portion of the substrate rotated by the rotation holder and is moved to the position opposite to the peripheral portion.

9. The peripheral portion processing device according to claim 1, wherein the plurality of discharge ports discharge a removal liquid for removing liquid applied to the peripheral portion of the substrate as the processing liquid.

10. The peripheral portion processing device according to claim 1, wherein the plurality of discharge ports discharge a coating liquid for forming a coating film at the peripheral portion of the substrate as the processing liquid.

11. The peripheral portion processing device according to claim 1, wherein the discharger includes an inkjet type head.

12. A peripheral portion processing method for performing processing on an annular peripheral portion extending along an outer periphery of one surface of a substrate at least partially having a circular outer periphery, including the steps of:

holding and rotating the substrate by a rotation holder; and discharging a processing liquid from a discharger, wherein the discharger has a plurality of discharge ports arranged in one direction and can selectively discharge the processing liquid from the plurality of respective discharge ports, a length of the discharger in the one direction, in which the plurality of discharge ports are arranged, is smaller than a radius of the substrate, and the step of discharging the processing liquid includes during the processing of the peripheral portion, allowing the discharger not to move but to stay still with part of the discharger overlapping the peripheral portion of the substrate in a vertical direction and another part of the discharger not overlapping the peripheral portion of the substrate, such that a row of the plurality of discharge ports of the discharger crosses and faces the peripheral portion of the substrate rotated by the rotation holder, selecting discharge ports from which the processing liquid is to be discharged, and selecting discharge ports from which the processing liquid is not to be discharged, and not supplying the processing liquid to a position further inward than an inner edge of the peripheral portion and supplying the processing liquid to a position further outward than the inner edge of the peripheral portion, such that the processing liquid is discharged from the discharge ports selected to discharge the processing liquid, and the processing liquid is not discharged from the discharge ports selected not to discharge the processing liquid.

13. The peripheral portion processing device according to claim 12, further comprising the steps of:

detecting a change in position of the outer periphery of the substrate rotated by the rotation holder; and determining, based on the change in position of the outer periphery of the substrate, a relationship between a rotation angle of the substrate held by the rotation holder and one or more discharge ports, from which the processing liquid is to be discharged, of the plurality of discharge ports, and allowing the processing liquid to be discharged from the one or more discharge ports of the plurality of discharge ports of the discharger based on the rotation angle of the substrate rotated by the rotation holder and on the determined relationship, wherein the determining step determines a discharge port that is opposite to the inner edge of the peripheral portion of the substrate and a discharge port that is opposite to a region located at a position further outward than the inner edge of the peripheral portion of the substrate as the one or more first discharge ports, from which the processing liquid is to be discharged, of the plurality of discharge ports, and the allowing step allows the processing liquid to be discharged from the one or more first discharge ports determined in the determining step, and wherein the determining step further determines a periodic curve indicating the change in position of the outer periphery of the substrate rotated by the rotation holder, and determines the one or more first discharge ports based on the periodic curve.

* * * * *